United States Patent
Muranaka et al.

(10) Patent No.: US 6,577,530 B2
(45) Date of Patent: Jun. 10, 2003

(54) SEMICONDUCTOR MEMORY DEVICE HAVING MEMORY CELLS EACH CAPABLE OF STORING THREE OR MORE VALUES

(75) Inventors: Masaya Muranaka, Akishima (JP); Yutaka Ito, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/982,162

(22) Filed: Oct. 19, 2001

(65) Prior Publication Data

US 2002/0071308 A1 Jun. 13, 2002

(30) Foreign Application Priority Data

Oct. 23, 2000 (JP) ........................... 2000-323043

(51) Int. Cl.[7] .............................. G11C 11/40
(52) U.S. Cl. ......................... 365/177; 365/168
(58) Field of Search .................. 365/174, 177, 365/168, 145, 149

(56) References Cited

U.S. PATENT DOCUMENTS 4,811,305 A * 3/1989 Watanabe et al. ........... 365/239
5,737,261 A * 4/1998 Taira .......................... 365/145
5,796,650 A * 8/1998 Wik et al. ............... 365/189.01
5,903,505 A * 5/1999 Wik et al. ................... 365/222

FOREIGN PATENT DOCUMENTS

JP        A-10-228781        8/1998

OTHER PUBLICATIONS

Japanese Literature "VLSI Memory" by Kiyoo Ito, Nov. 5, 1994, pp. 12–15.

* cited by examiner

Primary Examiner—Tan T. Nguyen
(74) Attorney, Agent, or Firm—Antonelli, Terry, Stout & Kraus, LLP

(57) ABSTRACT

Memory cells are used which each have a MOSFET that holds an information voltage of three or more values at its gate, a writing transistor that supplies the information voltage of three or more values to the gate of the MOSFET, and a reading transistor connected in series with the MOSFET. A plurality of reference voltages corresponding to the information voltage of three or more values are applied from a source line to the sources of the MOSFETs, so that digital data is produced by a combination of on-state/off-state of the MOSFET and the plurality of reference voltages or that the source voltages themselves of the MOSFETs are produced as read voltages.

17 Claims, 28 Drawing Sheets

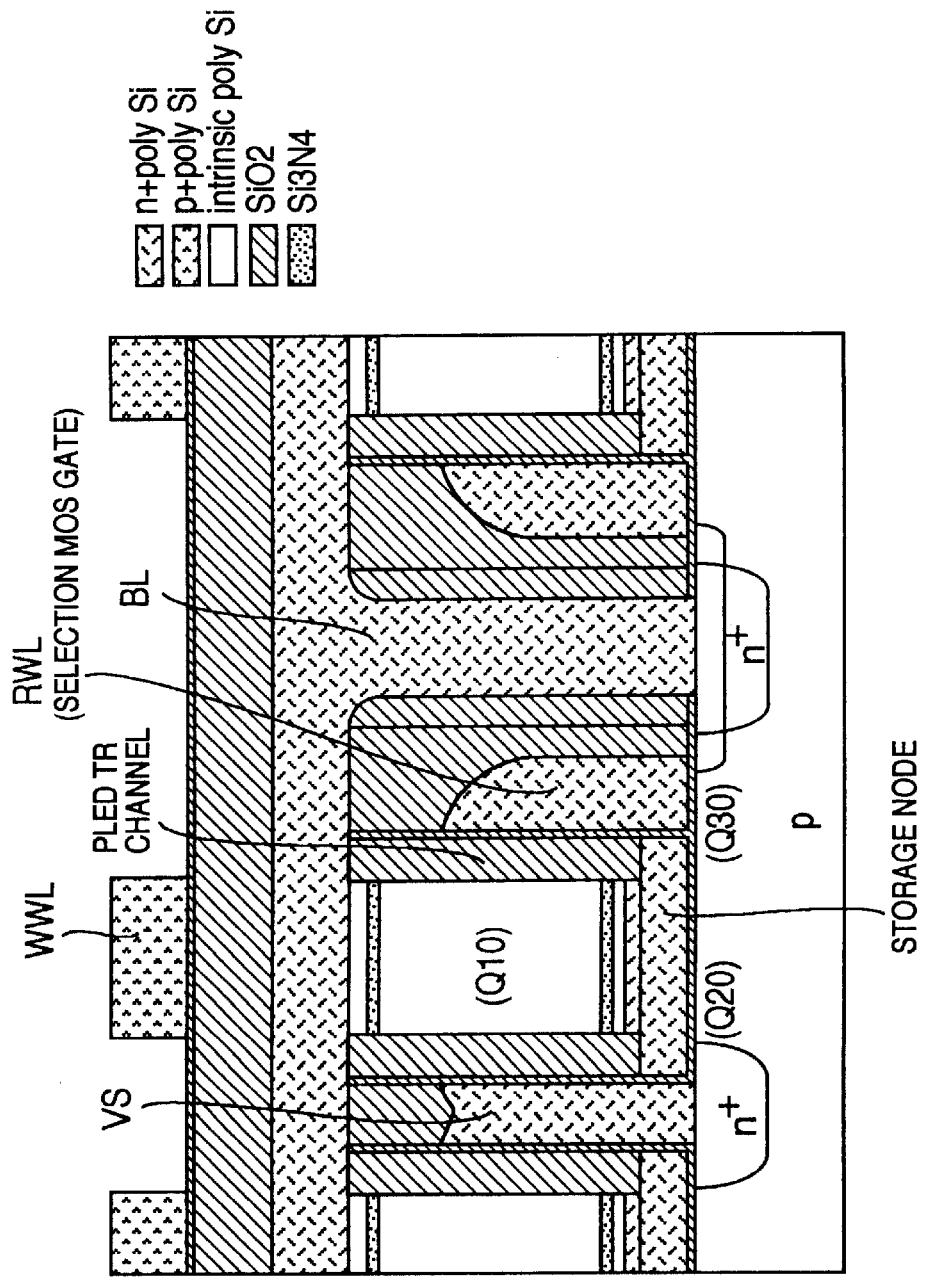

TUNNEL FILM ($Si_3N_4$, $SiO_2$, $SiO_xN_y$ 1-10nm)

tn = 0.27 μm
ts = 10nm
tg = 100nm

SEMICONDUCTOR MEMORY DEVICE HAVING MEMORY CELLS EACH CAPABLE OF STORING THREE OR MORE VALUES

BACKGROUND OF THE INVENTION

The present invention generally relates to semiconductor memory devices, and particularly to a technique useful for the application to what has highly-reliable and large storage-capacity semiconductor memory circuits.

The kinds of semiconductor memory devices can be broadly classified into RAM (random access memory), and ROM (read-only memory). Of these memories, dynamic RAM (DRAM) is used in largest quantities for main memory of computer. The memory cells of that memory are each formed of one storage electrostatic capacitor and a transistor that causes this capacitor to store electric charges and to read out the charges. This memory is suitable for large-scale integration because it can be formed of the smallest number of elements as a RAM. Therefore, it has been mass-produced at relatively low cost.

However, the DRAM has a drawback that the operation is easy to be unstable. The greatest factor for the instability is that the memory cell itself has no amplifying action, and hence the signal voltage read out from the memory cell is so small that the operation of the memory cell is easily affected by various kinds of noises. In addition, the information of charges stored in the capacitor disappears due p-n junction (leakage) current within the memory cell. Thus, before the information disappearence, the memory cell is required to refresh (writing for restoration), thereby holding the stored information. The period of this refreshment is called refreshment time, and under the present situation it is about 100 ms. However, it is necessary to increase the period with the increase of the storage capacity. In other words, the leakage current, which is required to be suppressed, becomes increasingly difficult to suppress as the memory device is further small-sized.

The memory that can solve this problem is ROM, particularly flash memory. The cell of the flash memory, as well known, is as small as the DRAM cell or smaller, and has a gain so that it can produce a substantially large signal voltage enough to stably operate. Moreover, since charges are stored at a storage node surrounded by an insulating film, there is no p-n junction current and hence the refreshing operation is not required unlike the DRAM. However, since a slight tunnel current is caused to flow at the storage node and store charges thereat, it takes an extremely long time to write. Repetition of writing will cause current to forcibly flow in the insulating film, thus gradually degrading the insulating film, so that finally the insulating film becomes a conductive film that cannot hold the stored charges. Therefore, the number of times that the flash memory produced as a commodity writes is generally limited to 100 thousands. In other words, the flash memory cannot be used as RAM. Since the DRAM and flash memory are both high-capacity memory, but each have advantages and disadvantages as described above, those different advantages must be used in order that the features of the memories can be well selected.

The so-called three-transistor cell that has a storage MOSFET for storing an information voltage at the gate, and a writing MOSFET for making the information voltage be written at the gate, is well known as described in, for example, "VLSI MEMORY" written by Kiyoo Ito, and published by Baifukan Nov. 5, 1994, pp. 12 to 15. In addition, JP-A-10-228781 (laid-open on Aug. 25, 1998) discloses a memory circuit having the three-transistor cell used for storing three or more logic states to thereby equivalently increase the storage capacity.

In the memory circuit proposed in the gazette, however, the gate voltage is amplified by the storage MOSFET, a selection MOSFET provided at the drain and a load resistor provided on a read data line, to be produced on the read data line. Therefore, since the variations themselves of the characteristics of the storage MOSFETs and selection MOSFETs of the memory cells appear in the output voltage, it is extremely difficult to stably read out voltages of three values or more, producing digital data. In addition, since the source and drain of the writing MOSFET are connected to the gate of the storage MOSFET, the multi-value information voltage is lost by the p-n junction (leakage) current like the DRAM. In order to securely hold this multi-value information voltage, it is necessary to make such refreshing operation as to read out the information voltage with a constant period, digitize it, convert to an analog voltage and again write in the original memory cell.

SUMMARY OF THE INVENTION

It is an object of the invention to provide a semiconductor memory device that has achieved a high-reliability large-storage capacity.

It is another object of the invention to provide a semiconductor memory device that has improved the usability in addition to the high-reliability large-storage capacity.

The above objects, other objects and noble features of the invention will become apparent from the description of this specification and the accompanying drawings.

According to one aspect of the invention, there is provided a semiconductor memory device in which memory cells are used which each have a MOSFET that holds an information voltage of three or more values at its gate, a writing transistor that applies the information voltage of three or more values to the gate of the MOSFET, and a reading transistor connected in series with the MOSFET, the writing transistor is controlled in a switching manner by write word lines in accordance with an address signal, the reading transistor is controlled in a switching manner by read word lines in accordance with an address signal, the information voltage is applied to write bit lines that are arranged in the direction perpendicular to the write word lines, a memory current flowing through the MOSFET and the reading transistor is caused to flow in read bit lines that are arranged in the direction perpendicular to the read word lines, and a plurality of reference voltages corresponding to the information voltage of three or more values are applied from a common source line to the sources of the MOSFETs so that the information of three or more values can be read by a combination of on-state/off-state of the MOSFET and the plurality of reference voltages.

According to another aspect of the invention, there is provided a semiconductor memory device in which memory cells are used which each have a MOSFET that holds an information voltage of three or more values at its gate, a writing transistor that applies the information voltage of three or more values to the gate of the MOSFET, and a reading transistor connected in series with the MOSFET, the writing transistor is controlled in a switching manner by write word lines in accordance with an address signal, the reading transistor is controlled in a switching manner by read word lines in accordance with an address signal, the information voltage is applied to write bit lines that are arranged in the direction perpendicular to the write word lines, and the source voltages of the MOSFETs are produced on read bit lines arranged in the direction perpendicular to the read word lines, and converted into a digital signal.

BRIEF DESCRIPTION OF THE DRAWINGS

FIG. 6 is a cross-sectional view taken along a line VI—VI in the memory cells of FIG. 4.

DESCRIPTION OF THE EMBODIMENTS

Figure 1:
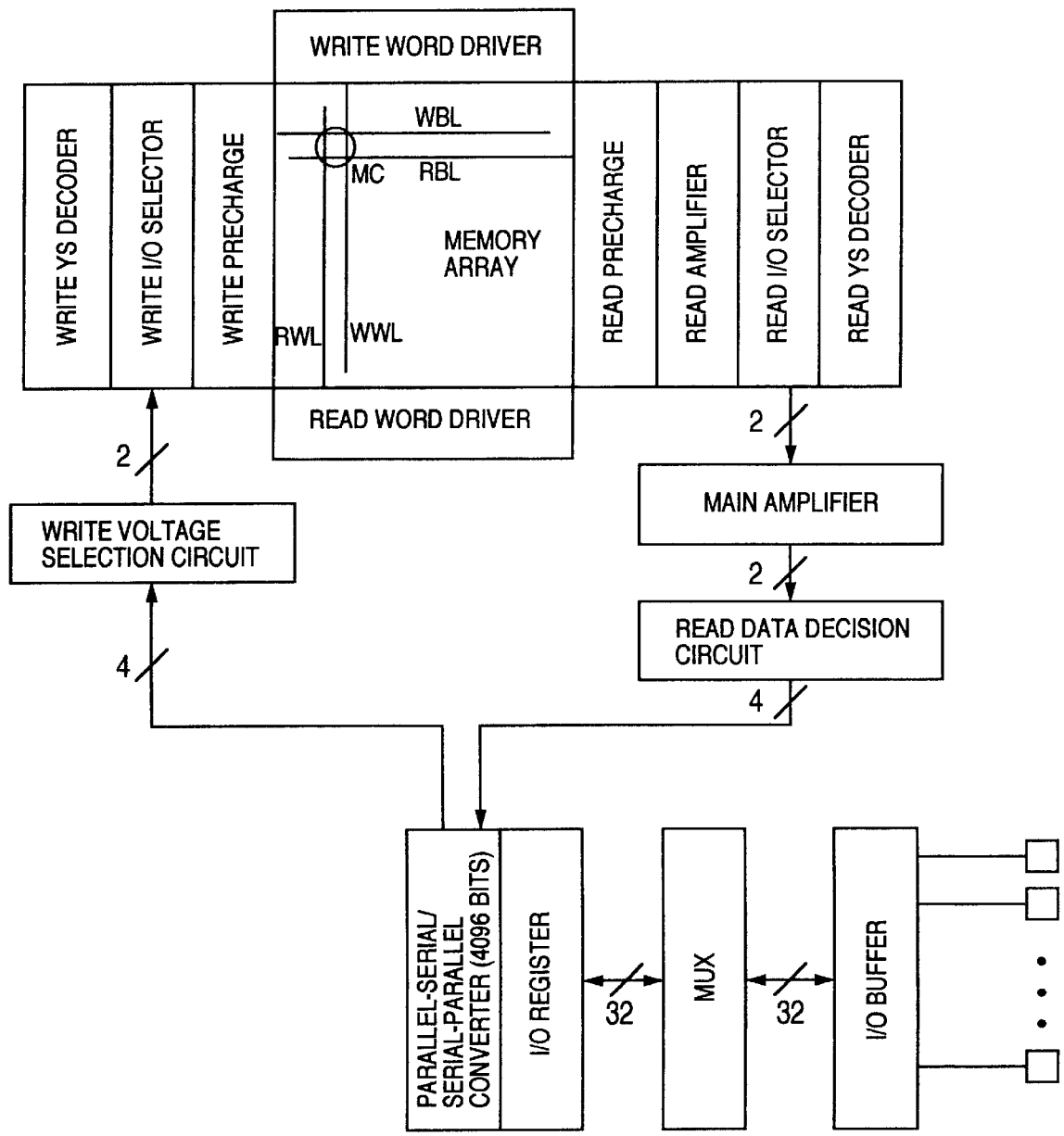
FIG. 1 is a block diagram of a semiconductor memory device according to an embodiment of the invention.

FIG. 1 is a block diagram schematically showing one embodiment of a semiconductor memory device according to the invention. The elements of the circuit blocks of FIG. 1 are built on a single substrate by the well-known manufacturing techniques for semiconductor integrated circuits. In this embodiment, the operations to write/read data are made for each unit of the bit number of the I/O register, though not particularly limited thereto. This bit is the unit of storing "0" or "1" in binary notation. The bit number of the I/O register is twice the memory cells connected to the word lines that are simultaneously activated within the memory array. If, for example, the memory array of this embodiment is formed of 16384 word lines×4096 bit lines (about 64 mega-cells=128 mega-bits), the bit number of the I/O register corresponds to 8192 (4096×2) bits.

A data multiplexer MUX is used to divide the data across the I/O register in accordance with the external input/output terminals or input/output bus width. A parallel-to-serial/serial-to-parallel converter is used to divide the data of I/O register into write/read data units of the memory array. In this embodiment, the external input/output terminal or input/output bus width is 32 bits, and the write/read data unit of the memory array is 2 bits, though not particularly limited thereto.

The memory array has memory cells MC provided at around the intersections of write word lines WWL, read word lines RWL, and write bit lines WBL, read bit lines RBL perpendicular to those word lines. The write word lines WWL and read word lines RWL are respectively selected by write and read word drivers that are provided on both sides (in FIG. 1, top and bottom sides) of the memory array in the extension direction of those word lines, though not particularly limited thereto.

Similarly, the following circuits are provided on both sides (in FIG. 1, left and right sides) of the memory array in the extension direction of the write bit lines WBL and read bit lines RBL. That is, for the write bit lines WBL, there are provided a write precharge, an write I/O selector and a write YS decoder for producing the selection signal on the left side of the memory array. For the read bit lines RBL, there are provided a read precharge, a read amplifier, a read I/O selector and a read YS decoder for producing the selection signal on the right side of the memory array.

To the write I/O selector are sequentially fed two writing voltages which are converted to have four values by a write voltage selection circuit. In other words, the write voltage selection circuit divides a four-bit writing signal into two parts of 2 bits each and converts each part into an information voltage of four values (digital/analog). The information voltages are supplied to the two write bit lines WBL selected by the write YS selector, and transmitted to the storage nodes of the memory cells corresponding to the selected write word line. The write YS selector updates the address of the write bit lines to be selected in accordance with the two writing voltages sequentially each made to have four values by the write voltage selection circuit and causes the writing voltages to be written in the memory cells (2048) corresponding to the selected write word line WWL.

In the reading operation, the signals read out on the read bit lines RBL corresponding to the on-state/off-state of the memory cells in which reference voltages are applied as the source line potential as will be described later are amplified by a main amplifier, and converted by a read data decision circuit into data of 2×2=4 bits, or in accordance with a combination of signals corresponding to a plurality of reference voltages applied to the source potential. The data is supplied through the parallel-to-serial/serial-to-parallel converter to the I/O register, where it is held. The read signal of 4096 bits held in this I/O register is converted by a data multiplexer MUX into data units of 32 bits each. The data units of 32 bits each are serially produced via an I/O buffer.

The semiconductor memory device of this embodiment makes input/output operation, or writing and reading operation on each data unit of 4096 bits (sector), or on each sector at a time, as in the flash memory, though not particularly limited thereto. The input circuit to receive the address signal for the access to memory, and a control signal for ordering an operation mode can take various constructions as does the known flash memory, and thus will be omitted in FIG. 1.

Figure 2:
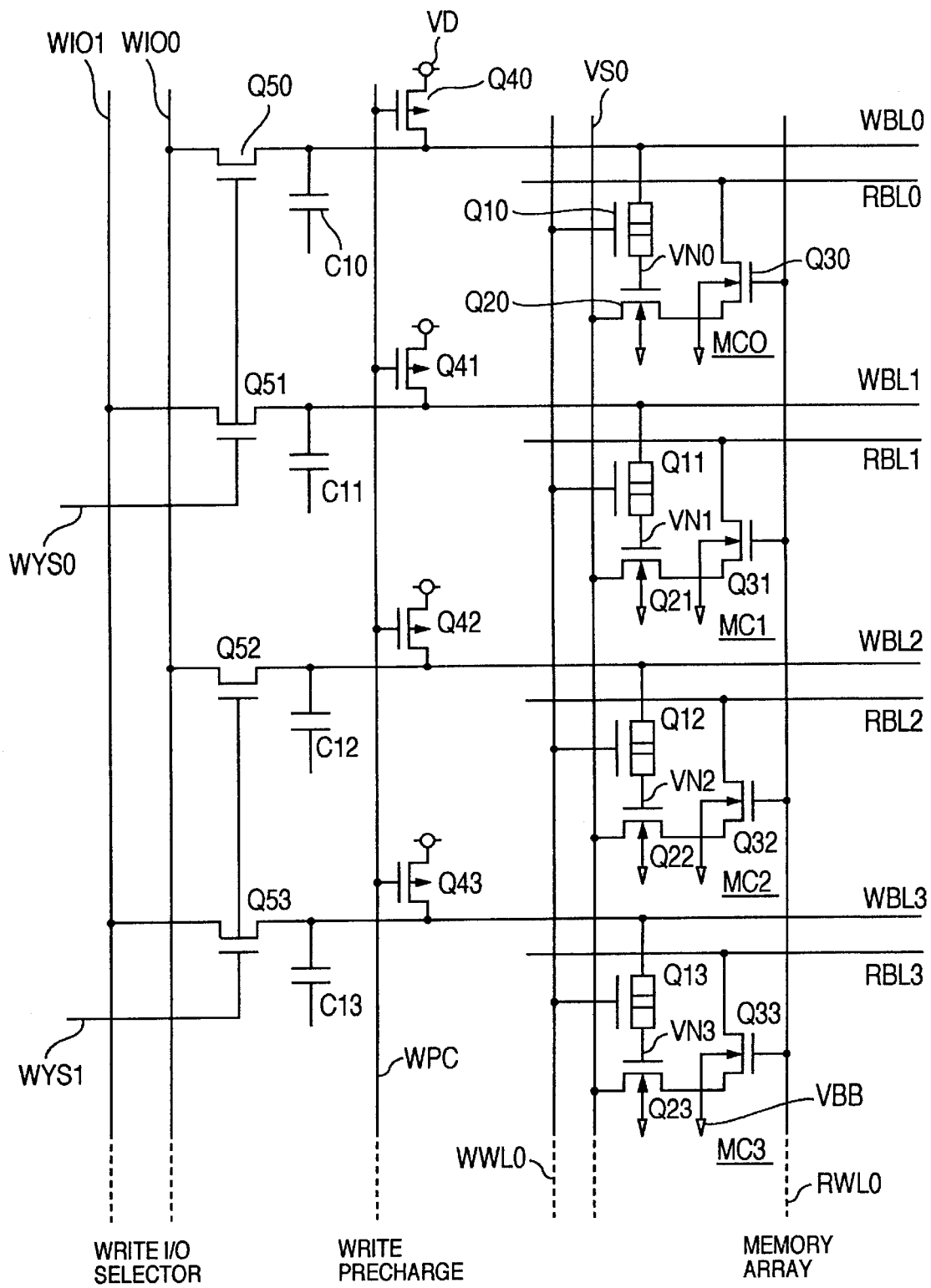
FIG. 2 is a circuit diagram showing part of the memory array and its peripheral circuit in the embodiment of FIG. 1.
Figure 3:
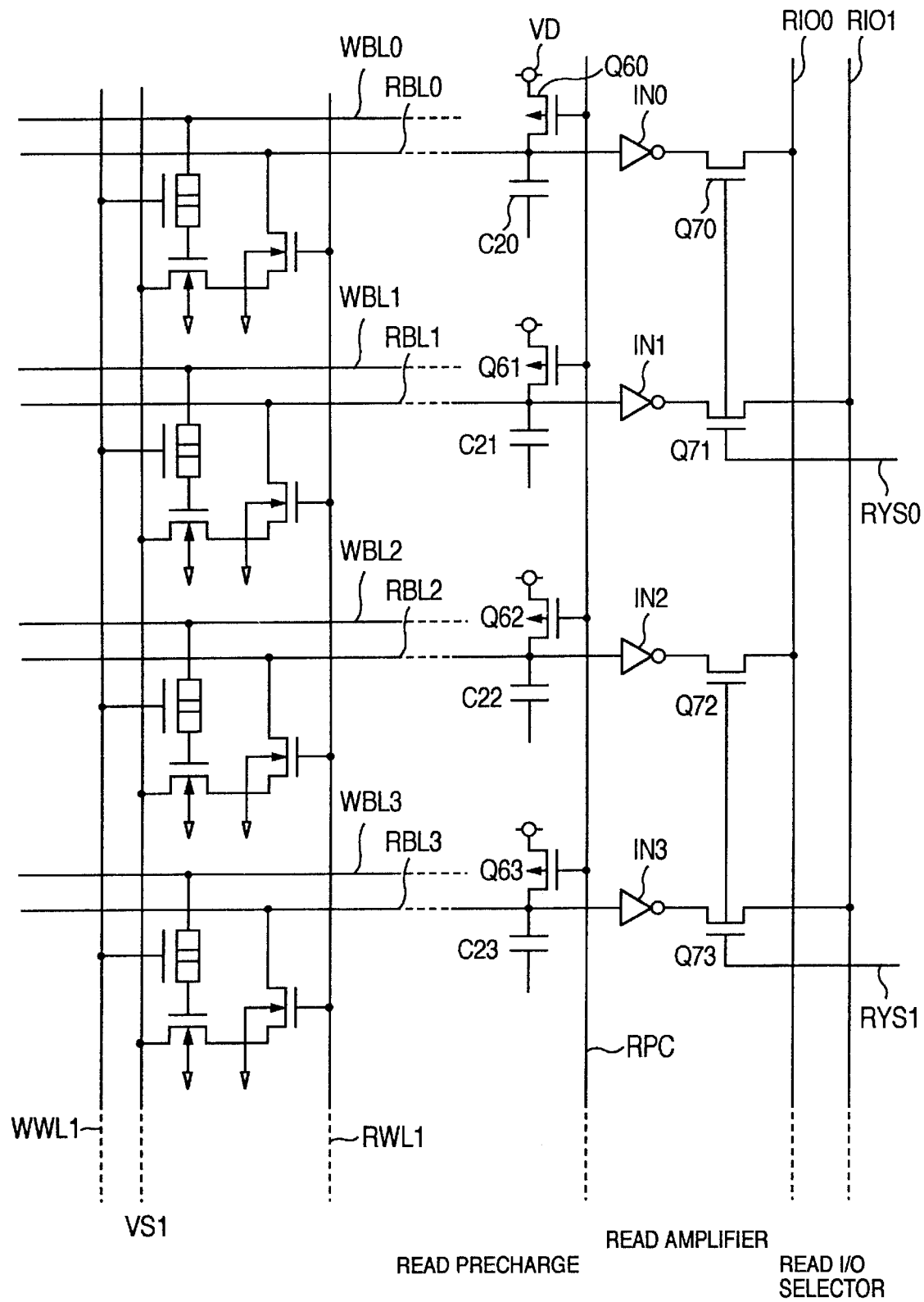
FIG. 3 is a circuit diagram showing part of the remaining portion of the memory array and its peripheral circuit in the embodiment of FIG. 1.

FIGS. 2 and 3 are circuit diagrams of the memory array and its peripheral circuits in the embodiment of FIG. 1. FIG. 2 shows the write I/O selector, write precharge circuit and memory array as the circuits of the writing system. FIG. 3 shows the read precharge circuit, read amplifier, read I/O selector and memory array as the circuits of the reading system.

This embodiment employs PLED memory in order to omit the refresh operation, though not particularly limited thereto. The PLED memory cell is formed to have a three-element (1 PLED+2 MOSs) structure for stable operation and to make use of the feature of gain cell's nondestructive readout so that the memory cell can store information of multiple values to achieve high reliability and large storage capacity at low cost like the flash memory.

The memory cell in this embodiment will be described briefly as follows. The PLED cell of three-element (1 PLED+2 MOSs) structure is used as a memory cell MC. In order to store two bits, or four values in each memory cell, four different potentials are defined for the charge storage node. In the writing operation, a write bit line potential that is fixed to a desired value of the four different potential values is applied to the storage node VN when the PLED transistor is turned on. In the reading operation, the source potential of the sense MOSFET is changed with the gate electrode used as the storage node VN and the potential of the storage node VN is detected from the source potential VS at which the sense MOSFET is turned on.

The three-element structure memory cell using a PLED transistor Q10 has a feature of nondestructive readout. Therefore, in the reading operation, since the stored information is not destructive, the voltage value (information) pluralized by division and stored can be detected by reading a plurality of times. In addition, since the PLED transistor has almost no leakage current as described later, the stored information is nonvolatile.

Referring to FIG. 2, there are typically shown four memory cells MC0~MC3 provided at the intersections between the write word line WWL0, read word line RWL0 and write bit lines WBL0~3, read bit lines RBL0~3. The PLED transistor has a barrier-insulating film structure as will be described later, or is formed of, for example, a completely depletion type MOS (of which the channel portion is a conductor) of SOI (Silicon On Insulator).

The memory cell MC0 corresponding to the write bit line WBL0 and read bit line RBL0 is formed of the PLED transistor Q10, a sense MOSFET Q20 and a switch MOSFET Q30. The PLED transistor Q10 has its gate connected to the corresponding write word line WWL0, one of its source and drain connected to the write bit line WBL0 and the other one connected to the storage node VN0. The sense MOSFET Q20 has its gate as the storage node VN0 connected to the other one of the source and drain of the PLED transistor Q10, one of its source and drain connected to the memory cell reference potential line VS0 which will be described later, and the other one connected to the switch MOSFET Q30.

The switch MOSFET Q30 has its gate connected to the read word line RWL0, one of its source and drain connected to the sense MOSFET Q20, and the other one connected to the read bit line RBL0. VBB represents the substrate node common to the sense MOSFET Q20 and switch MOSFET Q30. The three remaining memory cells MC1~MC3 corresponding to the other write bit lines WBL1~3 and read bit lines RBL1~3 have the same structure as the memory cell MC0.

In the write I/O selector, two write input lines WIO0, WIO1 are connected via switch MOSFETs Q50, Q52 and switch MOSFETs Q51, Q53 to the write bit lines WBL0, WBL2, and write bit lines WBL1, WBL3, respectively. In other words, the selection signals WYS0 and WYS1 generated from the write YS decoder force the write input lines WIO0, WIO1 to be connected to the write bit lines WBL0, WBL1, and WBL2, WBL3, respectively.

The write bit lines WBL0~WBL3 of the memory array are connected to a precharge signal line WPC via precharge MOSFETs Q40~Q43 that constitute the write precharge circuit. The write bit lines WBL0~WBL3 respectively have capacitors C10~C13 connected, though not particularly limited thereto. These capacitors C10~C13 are used to hold the information voltages of four values transmitted through the write input lines WIO0, WIO1, and switch MOSFETs Q50, Q51, Q52 and Q53. If the number of memory cells corresponding to a single write word line is small and takes a short time to write, those capacitors can be omitted.

Figure 9:
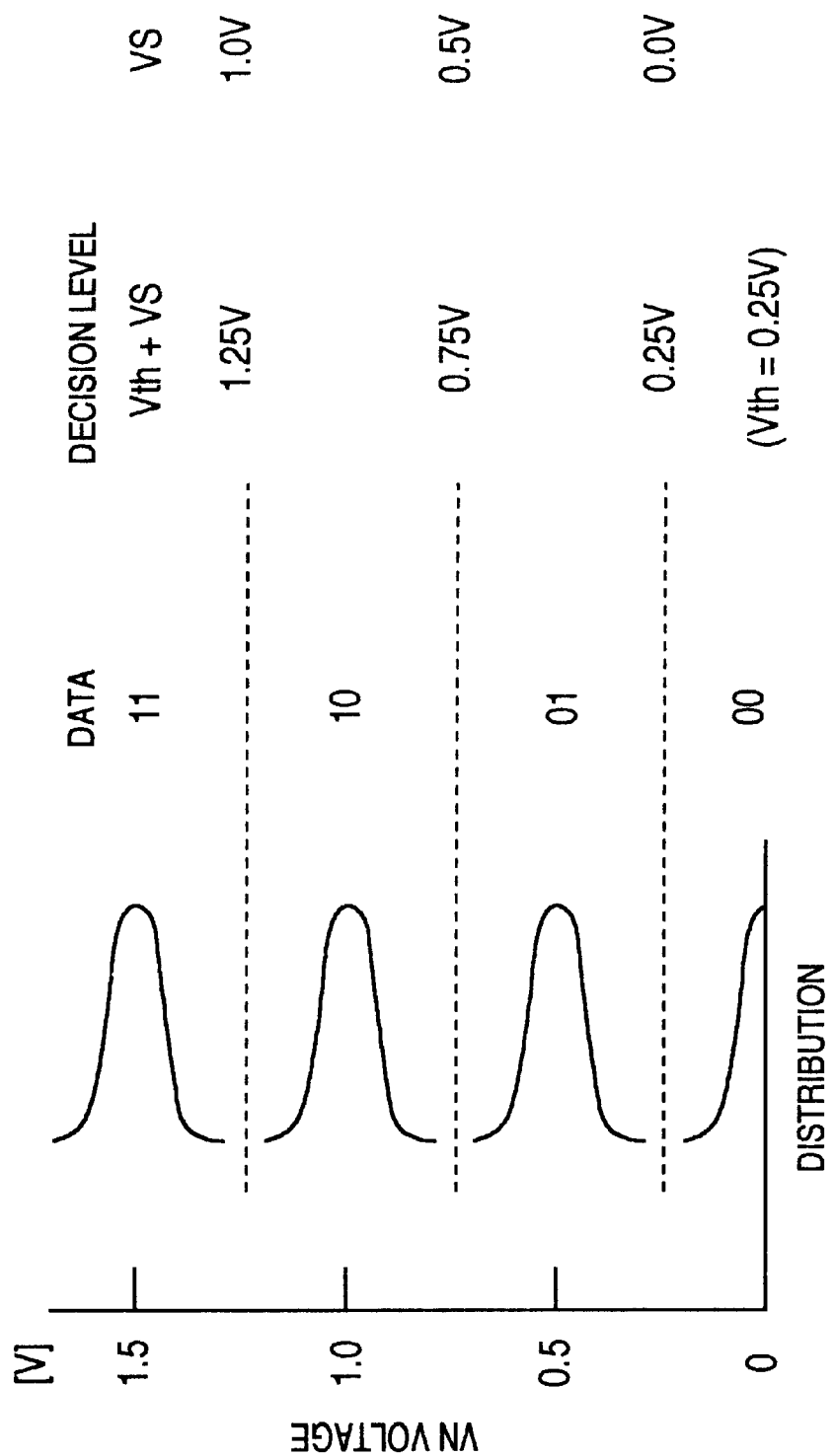
FIG. 9 is a graph showing the potential distribution of the storage node of the memory cell in the embodiment of FIG. 1.

FIG. 9 shows the potential distribution of the storage node. The maximum potential is 1.5 V and divided into four different regions, though not particularly limited thereto. This embodiment defines those regions as 0~0.25 V for data of "00", 0.25~0.75 V for "01", 0.75~1.25 V for data of "10", and 1.25~1.50 V for data of "11". The widths of the distribution, or regions are determined by considering the variation of the characteristics of the power supply and peripheral circuit elements.

The writing operation will be described with reference to FIGS. 1 and 2 and FIGS. 9 and 10. Here, the description will be made about the case in which as typically illustrated in FIG. 2, the data of "00", "01", "10" and "11" are respectively written in the four memory cells MC0~MC3 associated with the write bit lines WBL0~WBL3. The central voltages at the storage nodes VN0~VN3 associated with the writing data "00", "01", "10", "11" are 0 V, 0.5 V, 1.0 V and 1.5 V, respectively as shown in FIG. 9.

Figure 10:
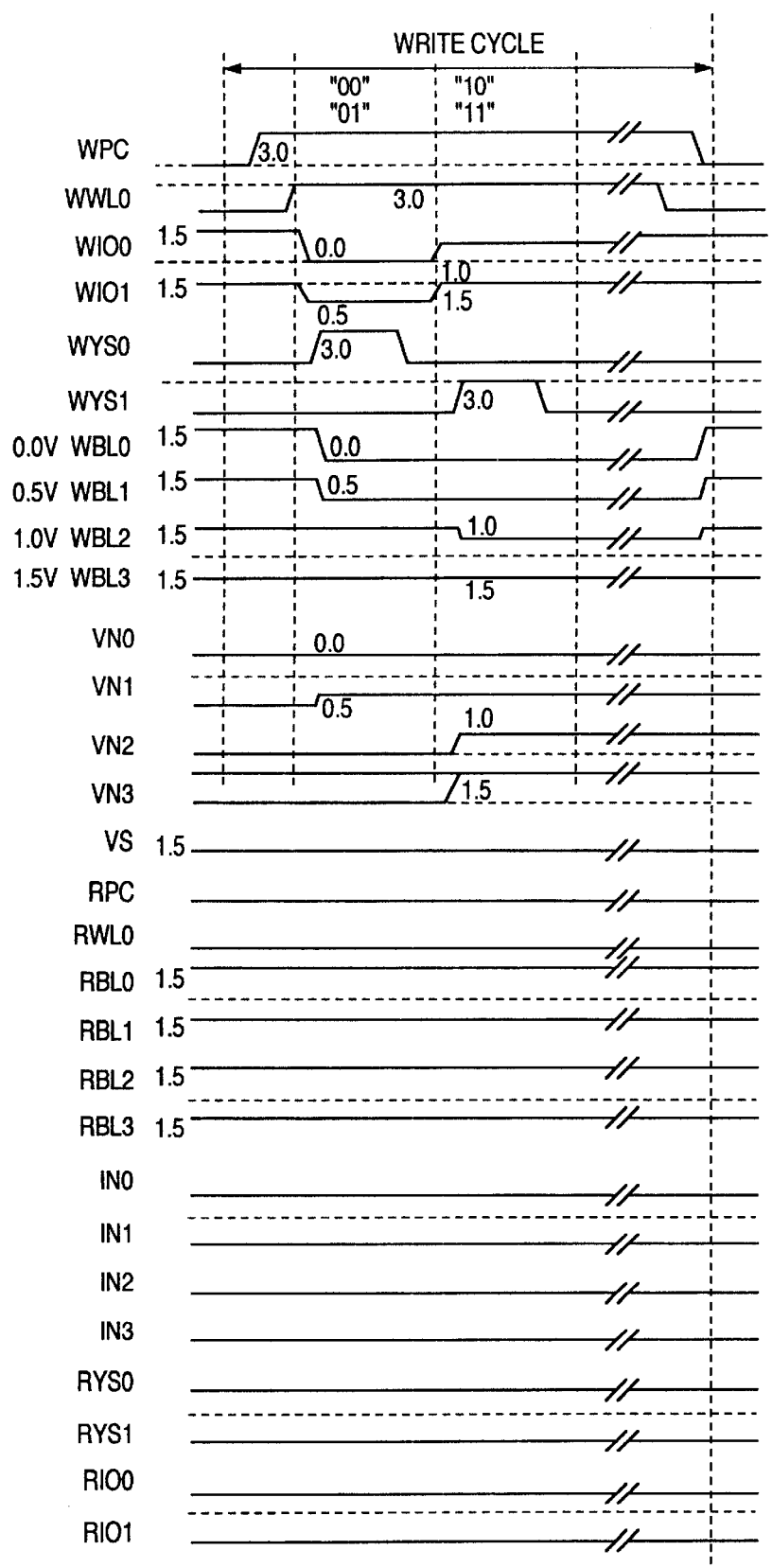
FIGS. 10 to 13 are waveform diagrams to which reference is made in explaining one example of the operation of the embodiment of FIGS. 1 to 3.

Referring to FIGS. 2 and 10, when the write precharge signal WPC is turned high level from low level, making the P-channel MOSFETs Q40~Q43 turned off from the on-state, the voltage VD (3.0 V) is stopped from precharging the capacitors C10~C13. Then, information voltages of 0.0 V and 0.5 V are applied to the write input lines WIO0 and WIO1, respectively. The setting of potential to the write input lines WIO0, WIO1 is made by the write voltage selection circuit provided in the peripheral circuit according to the data transmitted from the parallel-to-serial/serial-to-parallel converter.

The write word line WWL0 is placed at a selection level of high level (3.0 V). When the selection signal WYS0 is activated, the potential values of the write bit lines WBL0 and WBL1 are 0.0 V and 0.5 V, respectively. Since the write word line WWL0 is at high level (3.0 V), the PLED transistors Q10~Q13 are conductive, and thus the storage nodes VN0 and VN1 of the memory cells MC0 and MC1 are respectively held at 0.0 V and 0.5 V through the PLED transistors Q10 and Q11 that are conductive. Subsequently, when the selection signal WYS0 is deactivated, potentials 0.0 V and 0.5 V remain on the stray capacitances C10, C11 the write bit lines WBL0 and WBL1 have, and thus the written states can be maintained.

Next, in order to write 1.0 V and 1.5 V to the storage nodes VN2 and VN3 of the other memory cells MC2 and MC3, information voltages of 1.0 V and 1.5 V are respectively applied to the write input lines WIO0 and WIO1 from the write voltage selection circuit. When the selection signal WYS1 is activated, the MOSFETs Q52 and Q53 are turned on to transmit 1.0 V and 1.5 V to the write bit lines WBL2 and WBL3, respectively. Thus, the storage nodes VN2 and VN3 of the memory cells MC2 and MC3 are held at 1.0 V and 1.5 V, respectively. Then, similarly, when the selection signal WYS1 is deactivated, the information potentials of 1.0 V and 1.5 V remain at the stray capacitances C12 and C13 the write bit lines WBL2 and WBL3 have, and thus the written states can be maintained.

After desired information voltages of four values are written 1024 times in every two ones of the 2048 memory cells connected to the write word line WWL0 according to the same procedure, the write word line WWL0 is deselected, and the precharge signal line WPC is activated. If the potentials of the write bit lines WBL0 and WBL1 initially written when the write word line WWL0 is activated cannot be held enough until the write word line WWL0 is deactivated, imperfect potentials are stored in the storage nodes VNi of the memory cells. Therefore, gate capacitances or the like are required to be positively added to the write bit line WBL0 and so on in addition to the stray capacitance.

Referring to FIG. 3, the read I/O selector has two read output lines RIO0 and RIO1 provided in association with two read bit lines RBL0, RBL1 and read bit lines RBL2, RBL3, respectively. The read bit lines RBL0~RBL3 are connected to the input terminals of inverter circuits IN0~IN3 that constitute a read amplifier. The output terminals of these inverter circuits IN0~IN3 are connected to the read output lines RIO0 and RIO1 through switch MOSFETs Q70, Q71 and Q72, Q73, respectively. In other words, the selection signals RYS0, RYS1 generated from the read YS decoder force the read signals on the read bit lines RBL0, RBL1 and RBL2, RBL3 to be produced on the read output lines RIO0 and RIO1, respectively.

The read bit lines RBL0~RBL3 of the memory array are respectively connected through precharge MOSFETs Q60~Q63 that constitute the read precharge circuit to the read precharge signal line RPC. The read bit lines RBL0~RBL3 respectively have capacitors C20~C23 provided, though not particularly limited thereto. These capacitors C20~C23 are used to hold the precharge voltages from the read bit lines RBL0~RBL3. The capacitors C20~C23 used correspond to the stray capacitances of the read bit lines RBL0~RBL3. If necessary, it is possible to add the MOS capacitances provided on the write bit lines WBL0~WBL3.

Figure 11:
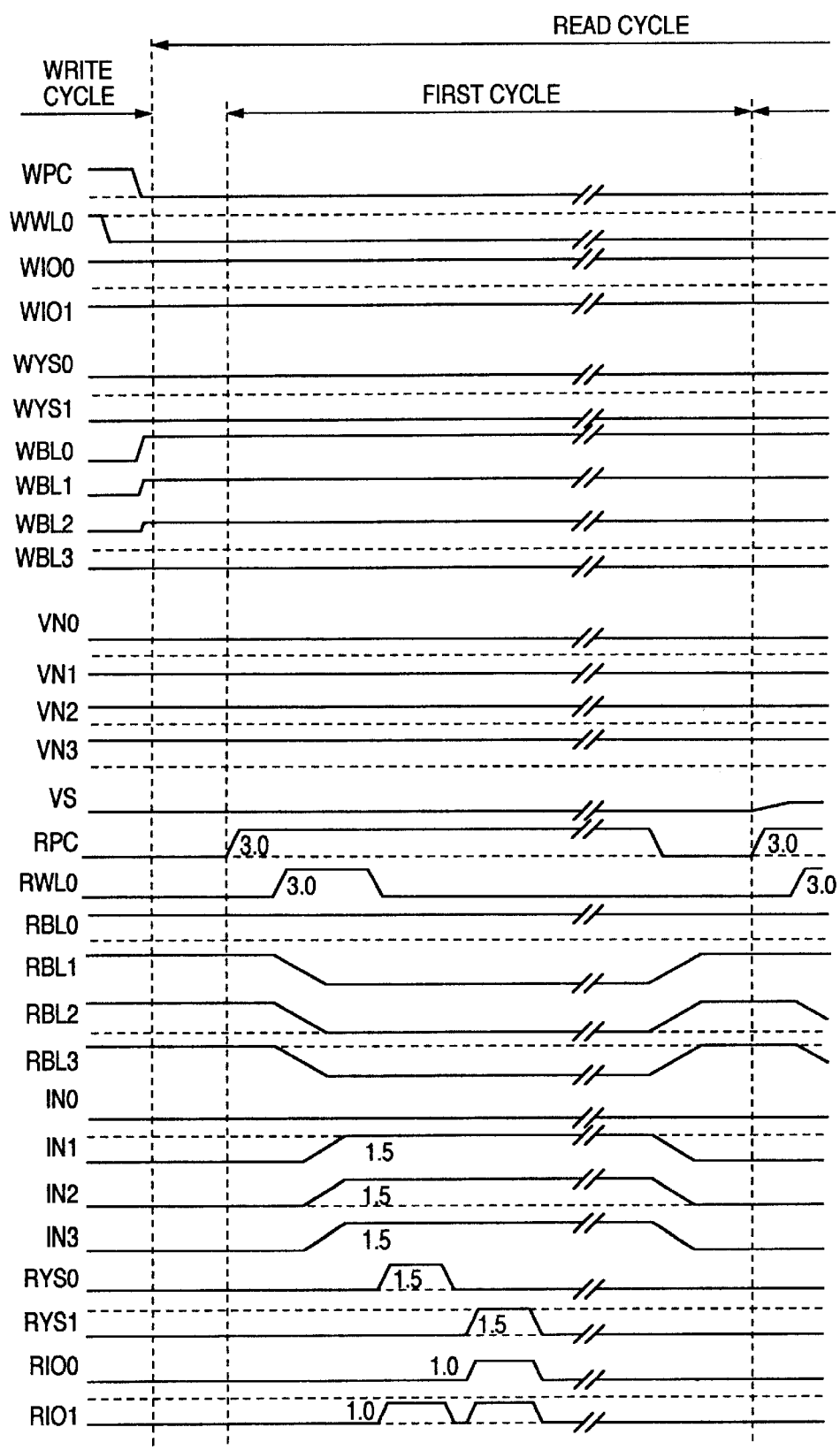
Figure 12:
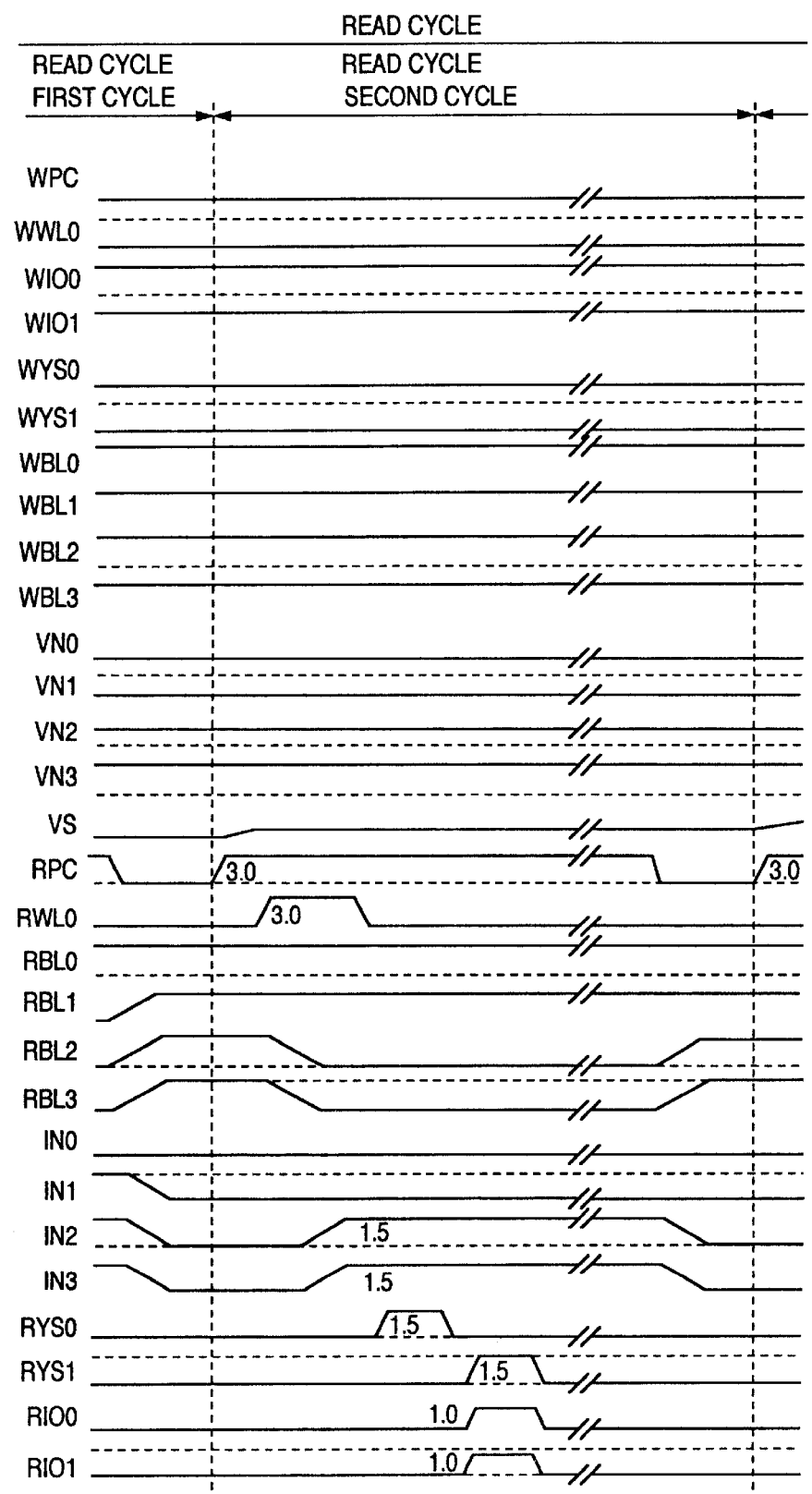
Figure 13:
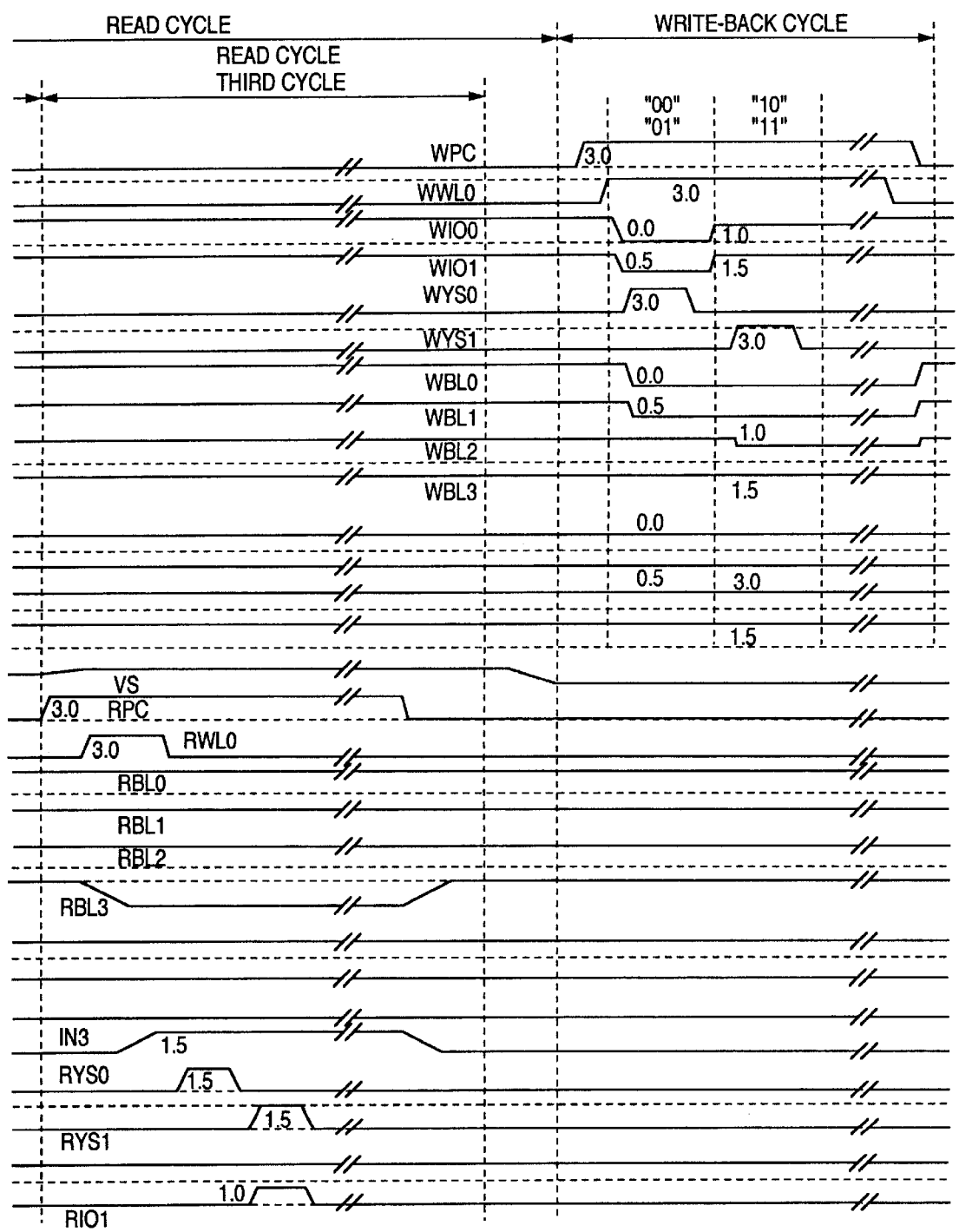

The reading operation will be described. The reading operation is executed in three cycles as shown in FIGS. 11 through 13 in order to decide the memory cell information of four-level values. The writing data "01", "01", "10" are decided in the first, second and third cycles, respectively. If decision is not made on a cell in any cycle, the writing data on that cell is decided "00".

In the first cycle, if the threshold Vth of the sense MOSFET is, for example, 0.25 V, and if the potential of the source line VS is set to be 0 V, the sense MOSFETs Q21~Q23 of the three memory cells MC1~MC3 that have their storage nodes VN1, VN2 and VN3 kept at the potentials of 0.5 V as written data "01", 1.0 V as "10" and 1.5 V as "11", respectively, have their gate-source voltage differences exceeding the threshold Vth, and thus are made in the on-state, but the sense MOSFET Q20 of the memory cell MC0 that has its storage node VN0 kept at 0.0 V as written data "00" is made in the off-state.

If the potential of the source line VS is set to be 0.5 V, the sense MOSFETs Q22 and Q23 of only the memory cells MC2 and MC3 that have their storate nodes VN2 and VN3 kept at the potentials of 1.0 V as written data "10" and 1.5 V as "11" have their gate-source voltage differences exceeding the threshold Vth, and thus become in the on-state. If the potential of the source line VS is set to be 1.0 V, the sense MOSFET Q23 of only the memory cell MC3 that has its storage node kept at the potential of 1.5 V as written data "11" has its gate-source voltage difference exceeding the threshold Vth, and thus becomes in the on-state. During these three-times reading operations, the sense MOSFET Q20 of the memory cell MC0 that has its storage node VN0 kept at the potential of 0.0 V as written data "00" is not turned on at all.

In each cycle, the precharge signal line RPC is deactivated, and the read bit lines RBL0~3 are in a floating state to be at high level. In the first cycle, as illustrated in FIG. 11, the source line VS is set to be 0.0 V, and the read word line RWL0 is activated. In the first cycle, the sense MOSFETs Q21~Q23 of the three memory cells MC1~MC3 other than the memory cell MC0 that has data "00" written are turned on, and thus the potentials of the corresponding read bit lines RBL1, RBL2 and RBL3 are reduced. Therefore, the output signals from the inverter circuits IN1~IN3 as the read amplifiers are turned high level from low level.

If the selection signal RYS0 is activated just when the output signals from all the read amplifiers (IN0~IN3) are fixed, the output signals from the read amplifiers IN0 and IN1 respectively become low level and high level according to the high level of the read bit line RBL0 and the low level of the RBL1. Thus, low-level and high-level signals are respectively produced on the read output lines RIO0 and RIO1 and amplified by the main amplifier.

Since data of "00" in the memory cell MC0 is decided at this decision stage of first cycle, two-bit "00" information is stored via the parallel-to-serial/serial-to-parallel converter in a portion of the I/O register corresponding to the memory cell MC0. On the other hand, since it is not decided at this stage if the memory cell MC1 has data of either "01", "10" or "11", it is temporarily decided that the memory cell MC1 has data of "01", two-bit "01" information is stored in a portion of the I/O register corresponding to the memory cell MC1 through the parallel-to-serial/serial-to-parallel converter.

Then, when the selection signal RYS1 is activated, the output signals of high level from the inverter circuits IN2 and IN3 are produced on the read output lines RIO0 and RIO1, and amplified by the main amplifier, so that it is decided that the sense MOSFETs Q22 and Q23 of the memory cells MC2 and MC3 are in the on-state. At this decision stage of first cycle, since it is not decided if the memory cells MC2 and MC3 have data of "01", "10" or "11" like the memory cell MC1, it is temporarily decided that they have data of "01", and two-bit "01" information is stored in the I/O registers corresponding to the memory cells MC2 and MC3.

Subsequently, all the memory cells on the RWL0 are read and decided as the memory cells MC0 and MC1 are. Finally, the read word line RWL0 is deactivated, the precharge signal RPC is activated, and the read bit lines RBL0~RBL3 are precharged.

In the second cycle, as illustrated in FIG. 12, the source line VS is set to be 0.5 V, and the read word line RWL0 is activated. In the second cycle, the sense MOSFETs Q22 and Q23 of the memory cells MC2 and MC3 other than the memory cells MC0 and MC1 that have data of "00" and "01" written, respectively, are turned on, and thus the potentials of the read bit lines RBL2 and RBL3 are reduced. Therefore, the output signals from the inverter circuits IN0 and IN1 as read amplifiers remain low level, and the output signals from the inverter circuits IN2 and IN3 are turned high level from low level.

At the stage where the selection signal RYS0 is activated, it is decided that the sense MOSFETs Q20 and Q21 of the memory cells MC0 and MC1 are both in the off-state. In this case, the I/O registers corresponding to the memory cells MC0 and MC1 are not updated newly. As a result, the I/O register corresponding to the memory cell MC0 still has data of "00" stored in the first cycle, and the I/O register corresponding to the memory cell MC1 still has data of "01" temporarily stored in the first cycle.

Then, when the selection signal RYS1 is activated, it is decided that the sense MOSFETs Q22 and Q23 of the memory cells MC2 and MC3 are both in the on-state. At this decision stage of second cycle, since it cannot be decided if the memory cells MC2 and MC3, though not "01", have data of "10" or "11", they are temporarily decided to have data of "10", and two-bit "10" information is stored in the I/O registers corresponding to the memory cells MC2 and MC3 through the parallel-to-serial/serial-to-parallel converter. Subsequently, all the memory cells on the RWL0 are read and decided as the MC0~MC3 are. Finally, the read word line RWL0 is deactivated, the precharge signal RPC is activated, and the read bit lines RBL0~RBL3 are precharged.

In the third cycle, as illustrated in FIG. 13, the source line VS is set to be 1.0 V, and the read word line RWL0 is activated. In the third cycle, since only the sense MOSFET Q23 of the memory cell MC3 that has data of "11" written is turned on, only the potential of the read bit line RBL3 is reduced. Therefore, the output signals from the inverter circuits IN1~IN2 as the read amplifiers remain low level, and only the output signal from the inverter circuit IN3 is turned high level from low level.

At the stage where the selection signal RYS0 is activated, it is decided that the sense MOSFETs Q20 and Q21 of the memory cells MC0 and MC1 are both in the off-state. In this case, the I/O registers corresponding to the memory cells MC0 and MC1 are not updated newly. As a result, the I/O register corresponding to the memory cell MC0 still has data of "00" stored in the first cycle, and the I/O register corresponding to the memory cell MC1 still has data of "01" temporarily stored in the first cycle.

Then, when the selection signal RYS1 is activated, it is decided that the sense MOSFET Q22 of the memory cell MC2 is in the off-state, and that the sense MOSFET Q23 of the memory cell MC3 is in the on-state. In this case, the I/O register corresponding to the memory cell MC2 is not updated newly. As a result, the I/O register corresponding to the memory cell MC2 still has data of "10" temporarily stored in the second cycle. Since the memory cell MC3 can be decided to have data of "11", two-bit "11" information is stored through the parallel-to-serial/serial-to-parallel converter in the I/O register corresponding to the memory cell MC3. Subsequently, all the memory cells on the read word line RWL0 are read and decided as the memory cells MC0~MC3 are. Finally, the read word line RWL0 is deactivated, the precharge signal RPC is activated, and the read bit line RBL is precharged.

When the stored voltages of four values are lost by the leakage current generated in the memory cells, the refresh operation is performed. In this refresh operation, after the read cycles shown in FIGS. 11~13 are carried out, the write-back cycle shown in FIG. 13 is performed. In other words, the data obtained by the reading operation and stored in the I/O register are written in the memory cells by exactly the same as the previous writing operation. That is, the refresh operation is performed by internally executing the normal reading and writing operations continuously. The above refresh operation can be omitted by use of transistors having the barrier-insulating film structure such as PLED transistors as given below. In other words, the stored information is nonvolatile. The relations of the on/off states and held data (held voltages) of the sense MOSFETs at each of the above cycles are as follows.

| WRITTEN(HELD) DATA | FIRST CYCLE (VS = 0.0 V) | SECOND CYCLE (VS = 0.5 V) | THIRD CYCLE (VS = 1.0 V) |
|---|---|---|---|
| "00"(VN0 = 0.0 V) | OFF | OFF | OFF |
| "01"(VN1 = 0.5 V) | ON | OFF | OFF |
| "10"(VN2 = 1.0 V) | ON | ON | OFF |
| "11"(VN3 = 1.5 V) | ON | ON | ON |

Figure 4:
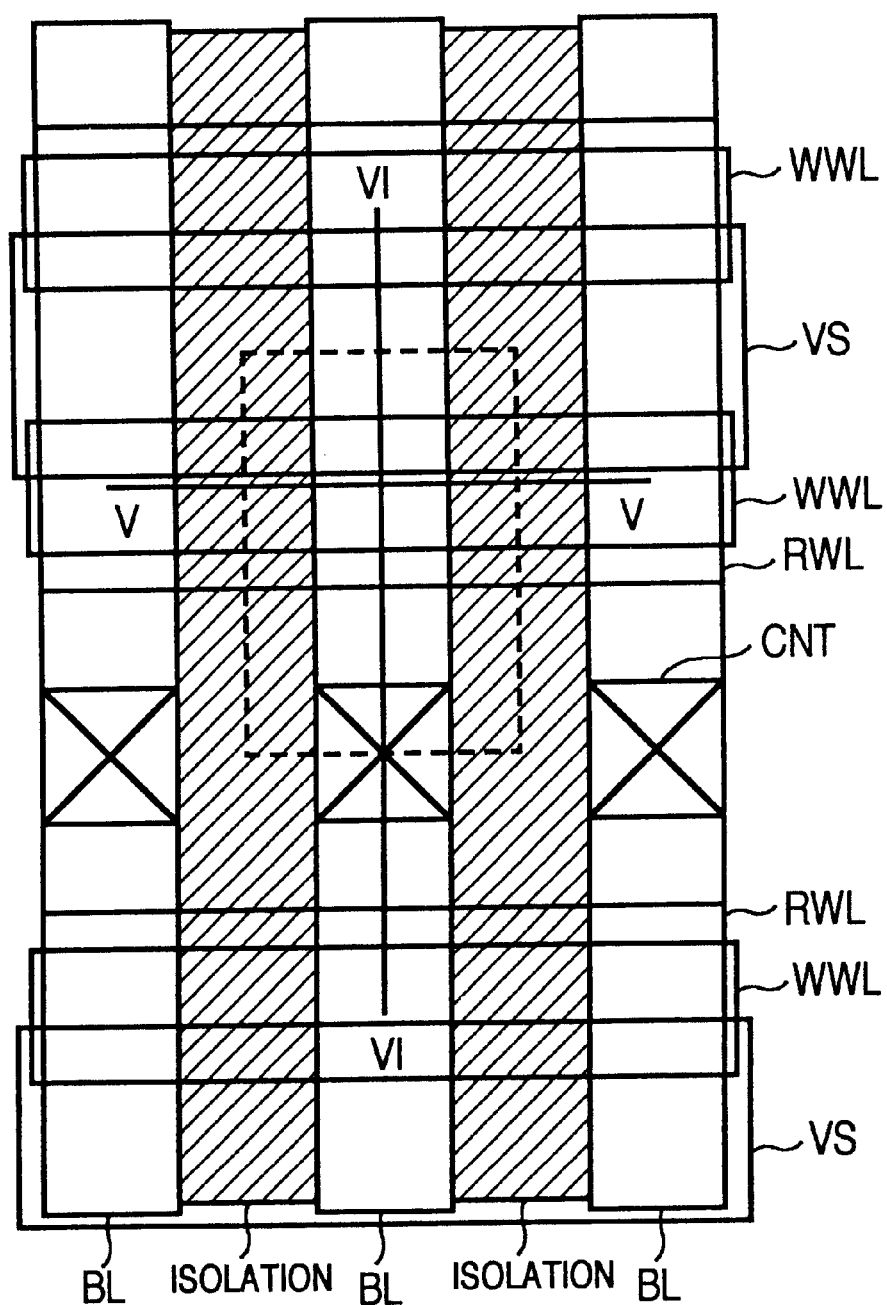
FIG. 4 is a diagram schematically showing the pattern of the memory cells in the embodiment of the invention.
Figure 5:
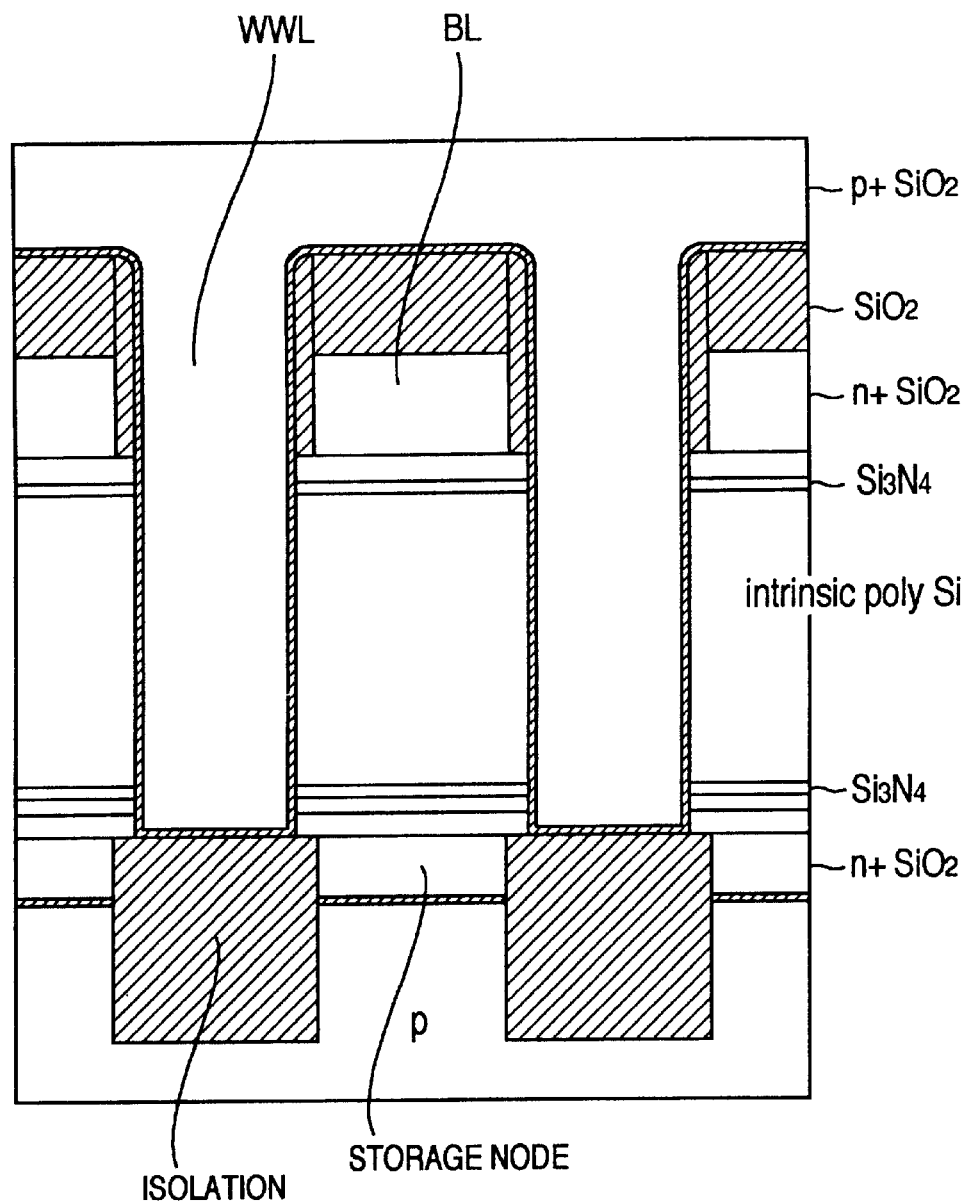
FIG. 5 is a cross-sectional view taken along a line V—V in the memory cells of FIG. 4.

FIG. 4 is a diagram schematically showing the pattern of one example of the memory cells according to the invention. FIG. 5 is a cross-sectional view of the memory cells taken along a line V—V in FIG. 4. FIG. 6 is a cross-sectional view of the memory cells taken along a line VI—VI in FIG. 4. FIG. 5 shows the cross-section of the memory cells along the extension of the word line WWL, and FIG. 6 shows the cross-section of the memory cells along the extension of the bit line BL.

As illustrated in the cross-section views of FIGS. 5 and 6, the PLED transistor Q10 has a great feature in the longitudinal type structure in which the gate electrode is provided on both sides of the five-layer laminated polysilicon ($n^+$poly Si—intrinsic poly Si—$n^+$poly Si) film with an oxide film interposed between them. In practice, both the gate electrodes made of polysilicon film are integrally formed and always kept at an equal potential. The polysilicon layers corresponding to the bit line BL and storage nodes have phosphor doped to about $10^{20}$ cm$^{-3}$ to form the drains D (or sources S) and sources (or drains) of transistors. The polysilicon provided between them has phosphor doped to an extremely low concentration ($10^{15}$~$10^{17}$ cm$^{-3}$) as intrinsic polysilicon (intrinsic poly Si) to form the substrate (channel) of the transistors.

Figures 7A, 7B:
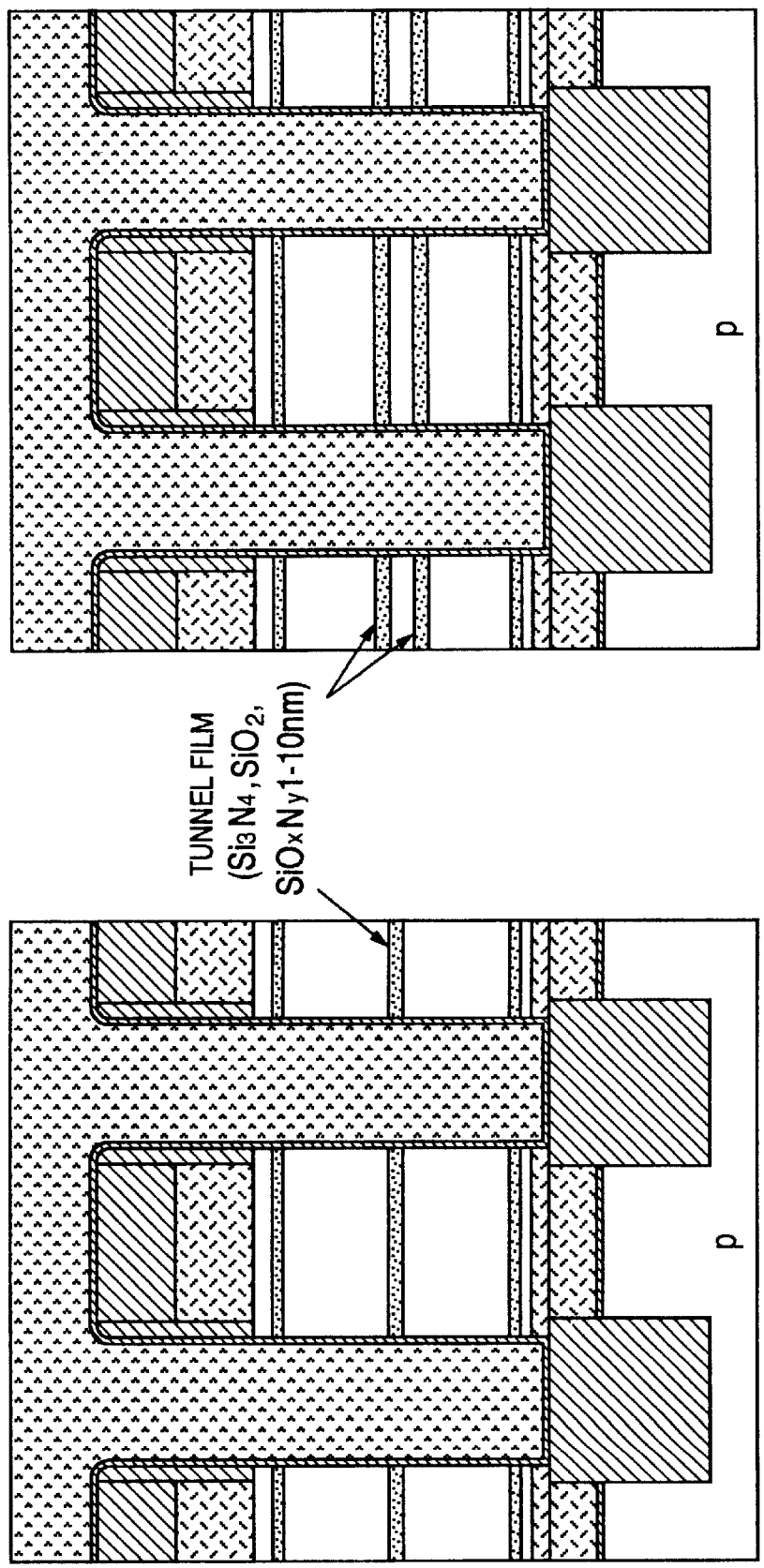
FIGS. 7A and 7B are cross-sectional views taken along the same line as in FIG. 5 in a modification of the memory cell of FIG. 4.

Tunnel films formed of, for example, a thin (2~3 nm) silicon nitride film ($Si_3N_4$) are built in each intrinsic polysilicon layer. The tunnel films are used to play a role as a stopper for preventing the high-concentration phosphor of the drain or source region from being diffused into the inside low-concentration layer when the transistors are formed. The tunnel films are required not to be too thick in order for current to flow in the drain-source path. An additional tunnel film may be formed in the central region as shown in FIG. 7A so that the off current of the transistors can be reduced to a small value. In other words, the holes or electrons generated in the polysilicon of the off-state transistors can be prevented from flowing between the drain and source electrodes by the stopper, so that the leakage current can be substantially reduced to zero.

When a sufficiently high positive voltage is applied to the gate of this PLED transistor Q10, the potential barrier of this tunnel film is reduced, thus allowing a sufficiently large on-current to flow in the drain-source path. Of course, this central tunnel film may be omitted differently from this embodiment depending on the target value of the off-current. Although the central film is formed of a single film, it may be formed of a multi-layer film as shown in FIG. 7B, if necessary. The typical size of the BMOS shown in FIG. 7B is substantially l=0.4 $\mu$m, d=0.2 $\mu$m, tox=10 nm. The transistor of this kind, if the thickness of the tunnel film is properly selected, can have a current-voltage characteristic similar to the normal transverse-type MOS transistor of which the substrate concentration is extremely low.

The maximum allowable value (i) of the current (IDS) flowing between the drain and source electrodes in order to guarantee, for example, keeping the stored data nonvolatile for ten years can be calculated as follows. If the capacitance (C) of the storage node (N) is 5 fF, and if the allowable value ($\Delta V$) that the storage node voltage is reduced during ten years ($\Delta t$) is 0.1 V, the maximum allowable value (i) can be given by $$i = C \cdot \Delta V / \Delta t = 1.6 \times 10^{-24} A.$$

On the other hand, in the normal circuit design, the threshold voltage VWT of the PLED transistor is defined by the gate-source voltage (VGS) for current of about IDS=$10^{-8}$ A. Since the relation between IDS and VGS in the current region from $10^{-24}$ A to $10^{-8}$ A can be expressed by a straight line in a semi-log scale, if the value of VGS that increases IDS by one order of magnitude is 100 mV, the following expression can be satisfied.

$$VTW\ 0.1\ (V/\text{figure}) \times 16\ (\text{orders of magnitude}) = 1.6\ V$$

This threshold voltage VTW is the minimum value under which the transistor (QW) can be kept off for about ten years. In the actual design, the standard threshold voltage VTW is set for 2 V considering the variation of the threshold voltage VTW and the temperature characteristic.

If the data holding time of a single memory cell may be about one day, the maximum allowable current is about $10^{-20}$ A, and thus the expression of VTW 0.1 (V/order of magnitude)×12 (orders of magnitude)=1.2 V can be satisfied. Considering the production difference, or variation, the standard threshold voltage VTW may be set for 1.2 V. Therefore, the maximum necessary word voltage (VDD+VTW or more) is reduced by the value that the threshold voltage VTW is reduced as compared with the nonvolatile operation, thus alleviating the requirement to the breakdown voltages of the write transistor (QW) within the memory cell and of the transistors within the peripheral circuit for driving the word lines.

In this case, the data in the memory cells can be held by using DRAM for the known refresh operation. In other words, the above reading and rewriting operations are sequentially and periodically performed for every word lines by driving word lines. In this case, since this operation may be carried out substantially once per day, the degree of the load on the refresh operation can be reduced as compared with the DRAM, and thus this memory can be handled substantially as nonvolatile memory.

Referring to FIG. 6, between the source and drain diffusion layers n$^+$, there are formed the sense MOSFET Q20 of which the gate electrode serves as the storage node formed of the source or drain of the PLED transistor, and in series therewith the selection MOSFET Q30 with the read word line RWL arranged in parallel with the storage node. That is, two MOSFETs Q20 and Q30 are integrally formed in parallel in the channel current direction.

The current in the sense MOSFET Q20 and selection MOSFET Q30 flow in parallel with the substrate surface, while the current in the PLED transistor Q10 flows perpendicularly to that current. Therefore, the memory cell that is formed of three transistors can be produced with a small area occupied and with its surface being little irregular, or flat. Accordingly, the memory chip can be relatively easily produced at low cost.

The memory cell of this embodiment can hold data for a sufficiently long time, and is very strong against the soft error due to the incidence of alpha ray or the like if only the threshold voltage (VTW) of the PLED transistor Q10 is correctly set. That is, since the storage node of the memory cell has no p-n junction, there is no junction leakage current unlike the known memory cell in which a MOSFET is used as a write transistor. In addition, even if electron-hole pairs are generated within the memory cell as a result of irradiation of alpha ray, the tunnel films serve as a stopper against the flows of electrons and holes, and thus the potential is not changed within the cell. Therefore, this memory can be operated as a nonvolatile memory from a theoretical standpoint.

This embodiment has the read bit lines RBL and write bit lines WBL formed common by the same bit lines BL, though not particularly limited thereto. In other words, the write bit lines WBL and read bit lines RBL shown in FIGS. 2 and 3 can be replaced by bit lines BL common thereto. When the common bit lines are used as above, information voltages of four values are applied to the write bit lines, while voltages on the read bit lines are produced associated with reference voltages and as inverted binary voltages so that the writing and reading operations are performed in separate time zones for avoiding their collision.

When the write bit lines WBL and read bit lines RBL are separately provided with no common bit lines BL as in the embodiment of FIGS. 2 and 3, the write bit lines WBL connected to the source or drain electrodes of the PLED transistors Q10 are formed of bit lines BL shown in those figures, and the read bit lines RBL are formed as an upper layer on the bit lines BL (WBL) with an insulating film interposed between them.

Figure 8B:
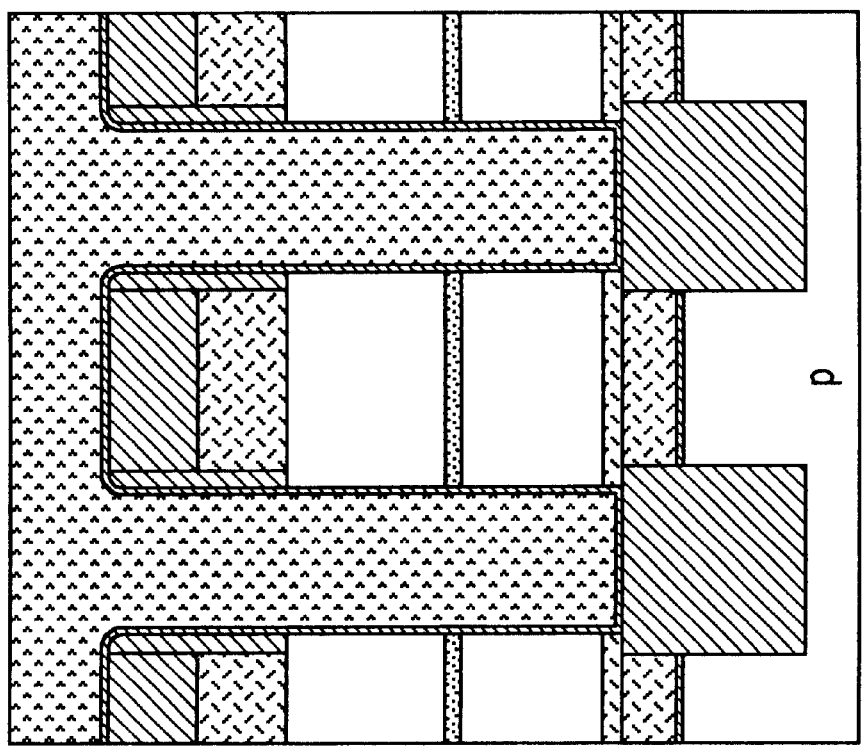
FIGS. 8A and 8B are cross-sectional views taken along the same line as in FIG. 5 in another modification of the memory cell of FIG. 4.
Figure 8A:
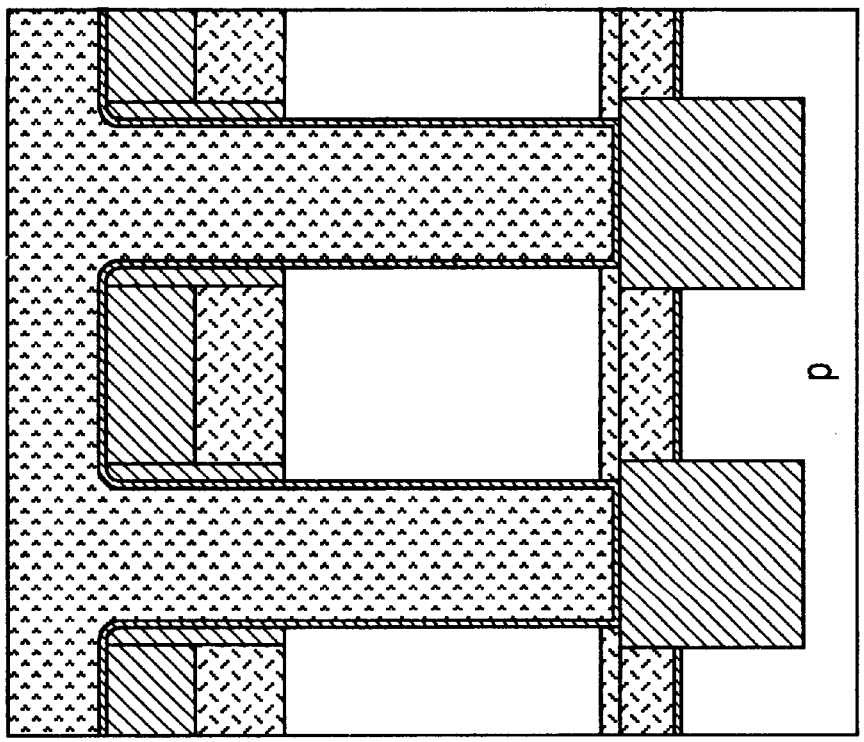

FIGS. 8A and 8B are cross-sectional views of a modification of the memory cells of this embodiment according to the invention. In this modification, the channel structure of the PLED transistor is different from that of the above embodiment. In FIG. 8A the tunnel film is not formed, but in FIG. 8B only a single tunnel film is provided at the central region. In this modification, the memory cells can be produced by a low-temperature process, and they are capable of large on-current and fast writing. Thus, the structure of the PLED transistor can be changed in various different ways.

Figure 14:
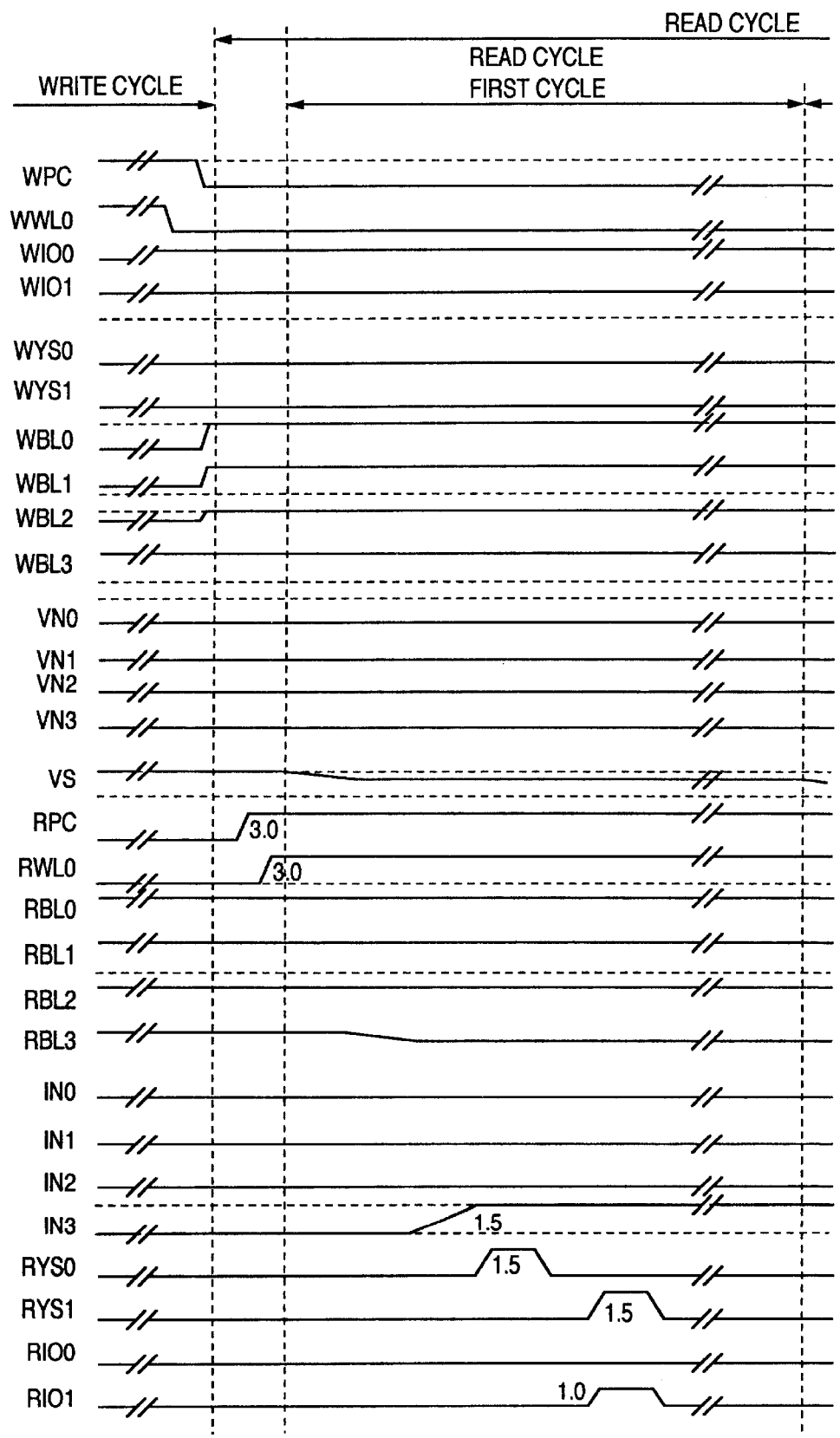
FIGS. 14 to 15 are waveform diagrams to which reference is made in explaining another example of the operation of the embodiment of FIGS. 1 to 3.
Figure 15:
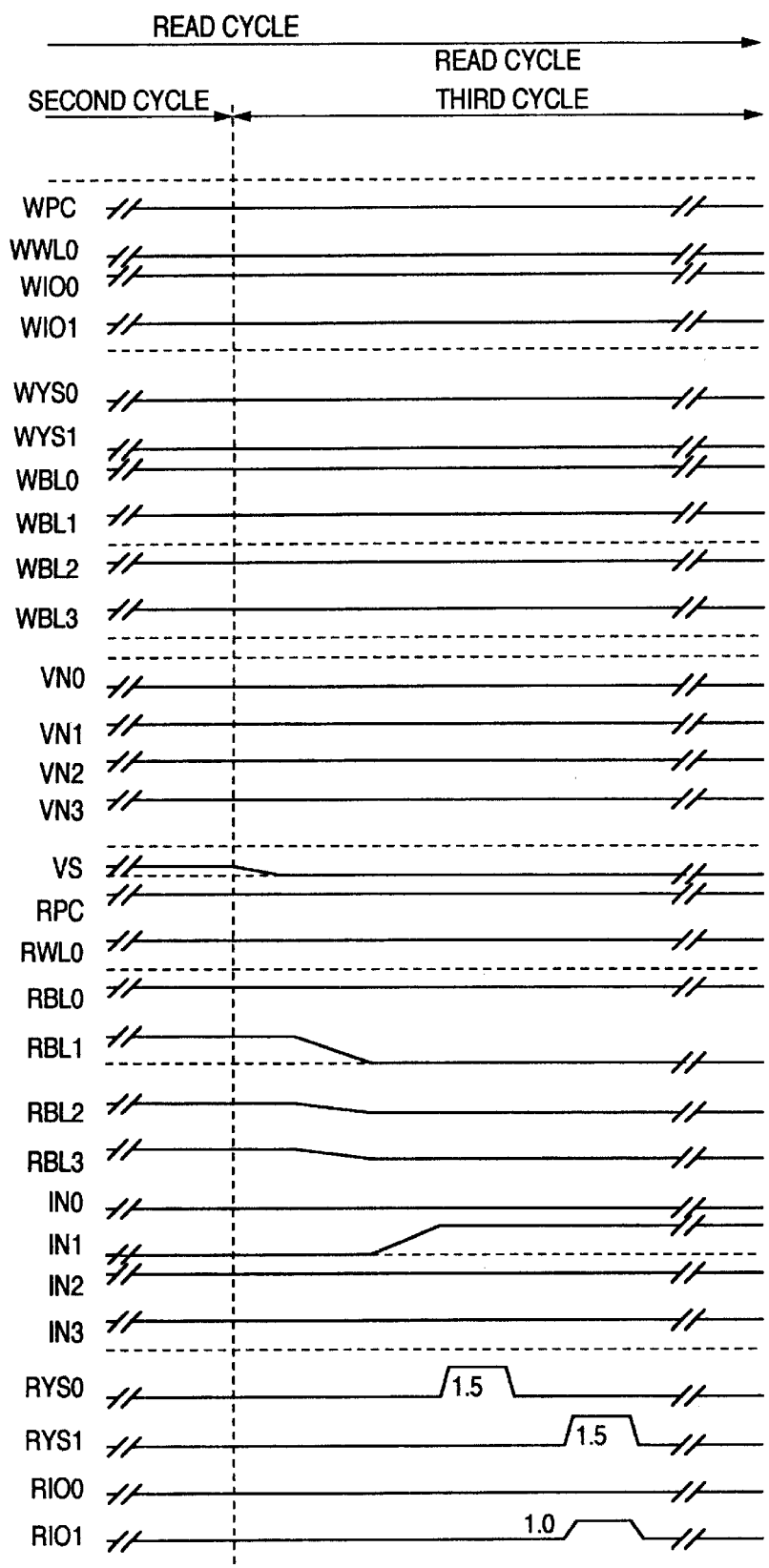

FIGS. 14 and 15 are waveform diagrams of another example of the reading operation of the semiconductor memory device shown in FIGS. 1 through 3. In FIG. 14 the first cycle of the reading cycle formed of three cycles is shown, and in FIG. 15 the third cycle thereof is shown. Although the second cycle is not shown, it can be easily analogized from the two diagrams.

Although the read control method shown in FIGS. 11 through 13 needs the activation, deactivation and precharging of the read bit lines RWL at each reading cycle, the read control method according to this modification changes the potential of the source line VS, or switches the reference voltages as 1.0 V→0.5 V→0.0 V in the first, second and third cycles of the three cycles contrary to those in the embodiment of FIGS. 11 through 13. Therefore, the read bit lines RWL are once activated, deactivated and precharged only in the first cycle, and those operations can be omitted in the second and third cycles. Thus, it can be expected to reduce the reading operation time and reduce the consumption power.

Figure 16:
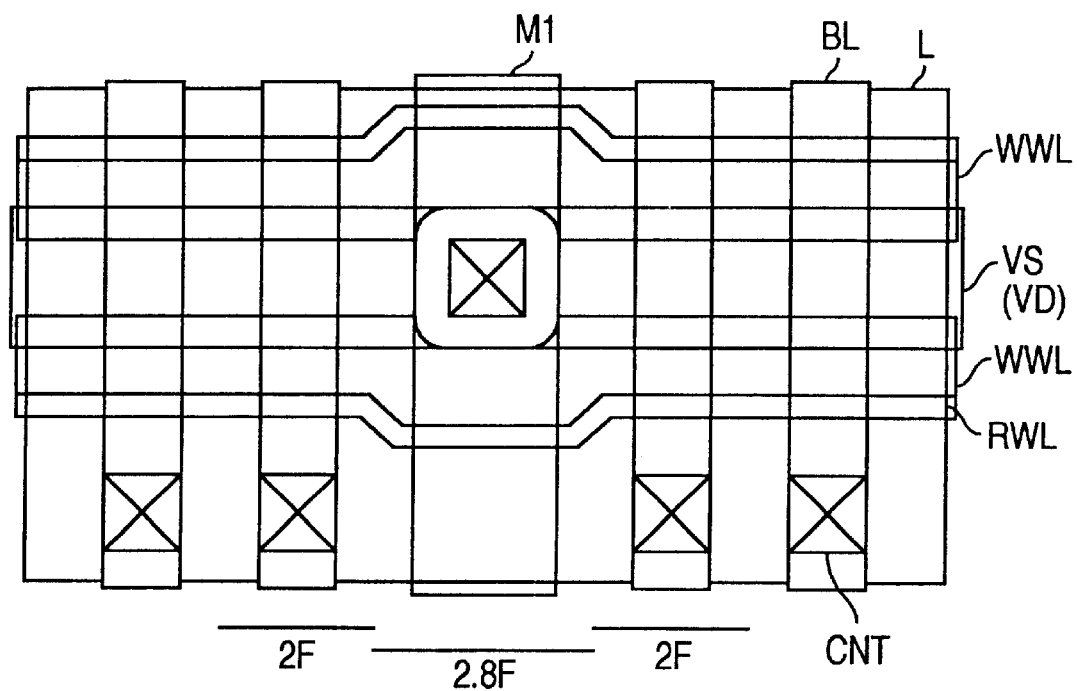
FIG. 16 is a diagram schematically showing the layout of the memory cells of another embodiment of the invention.

FIG. 16 is a diagram schematically showing the layout of the memory cells of another embodiment according to the invention. In this embodiment, in order that the source resistance can be reduced when the source electrodes of the sense MOSFETs Q20 of the memory cells are connected together in common, an aluminum layer M1, for example, is formed along the extension direction of the bit lines BL to connect to the source lines together that are extended in the word line direction. In other words, a low-resistance metal wiring layer made of aluminum or the like as an upper layer is formed to mutually connect the source lines so that the source line VS can be constructed in a network shape as a whole. This source line VS is replaced by the power supply line (VD) so that the source impedance can be reduced as in the embodiment which will be described below.

Figure 17A:
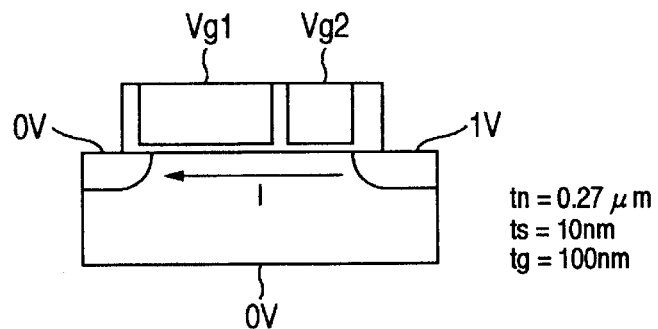
FIGS. 17A, 17B and 17C are diagrams to which reference is made in explaining the operation of the memory cell in the embodiment of the invention.
Figure 17B:
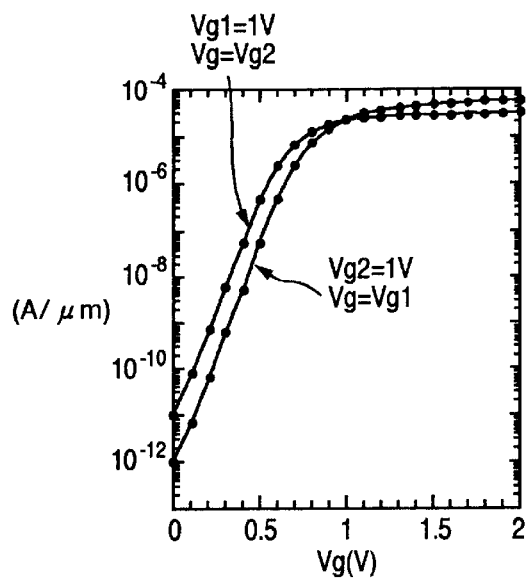
Figure 17C:
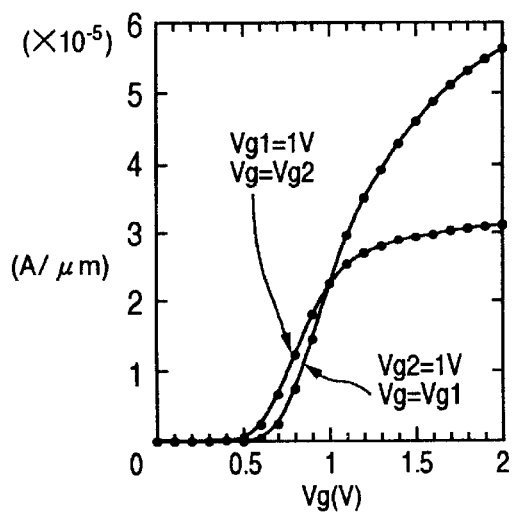

FIGS. 17A, 17B and 17C are diagrams to which reference is made in explaining the operation of the arrangement of the sense MOSFET Q20 and selection MOSFET Q30 with their gates arranged in parallel as in the embodiment of FIG. 6. In FIG. 17A the element structure as a model is shown, and in FIGS. 17B and 17C the voltage-current characteristics by computer simulation are shown. The current in FIG. 17B is expressed in a log (logarithm) scale, and the current in FIG. 17C is indicated in a linear scale.

For example, the first characteristic of the memory current I is shown when an information voltage $V_{g1}$=1 V is applied to the storage node VN corresponding to the gate of the sense MOSFET Q20, and a selection voltage $V_g$ is applied to the read word line RWL connected to the gate of selection MOSFET Q30, and the second characteristic of the memory current I is shown when the information voltage $V_g$ is applied to the storage node VN corresponding to the gate of the sense MOSFET Q20 and a voltage $V_{g2}$=1 V is applied to the word line RWL connected to the gate of the selection MOSFET Q30. The memory current necessary and sufficient for the above reading operation can be obtained from these current characteristics.

Figure 18:
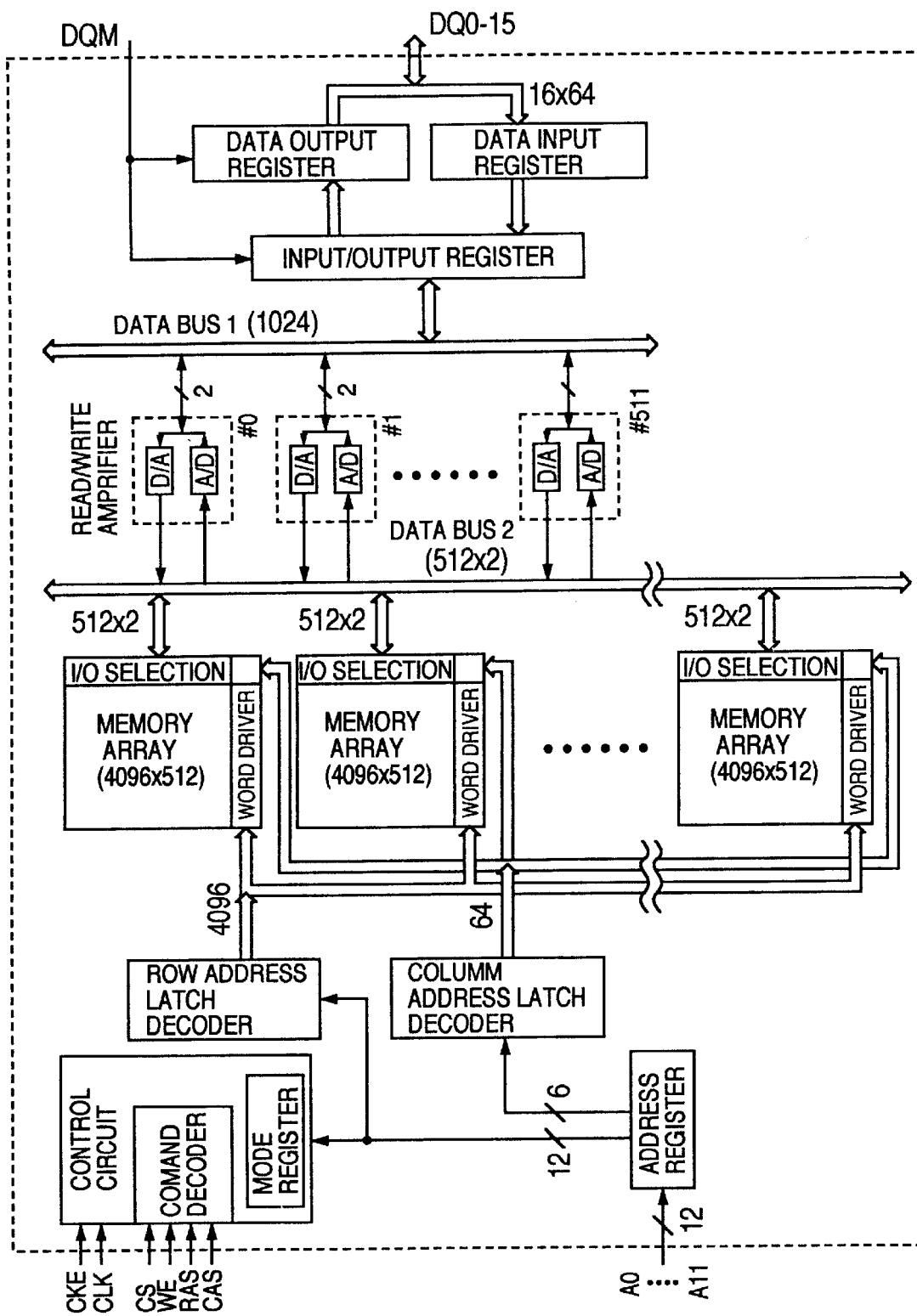
FIG. 18 is a block diagram of a semiconductor memory device according to another embodiment of the invention.

FIG. 18 is a block diagram schematically showing another embodiment of a semiconductor memory device according to the invention. The circuit blocks shown are formed on a single substrate by the well-known techniques for semiconductor integrated circuits. In this embodiment, too, the data writing and reading operations are made for every bit number unit of the input/output register. The bit is one unit for storing "0" or "1" of binary notation. The bit number of the input/output register is twice the memory cells connected to the word lines that are simultaneously activated within the memory array. If this example is 4096 word lines×512 bit lines×64 memory arrays (about 128 mega-cells=256 megabits), the bit number of the input/output register is 1024 (512×2) bits.

In this embodiment, a data output register and a data input register are also provided. The data output register receives the signal of 1024 bits read out from the input/output register, and serially sends the read-out signals of 16 bits (data bus width of 16 bits) each out through the data output terminals DQ0~DQ15 in 16 cycles. On the contrary, the write signals of 16 bits each are fed from the data terminals DQ0~DQ15 to the data input register until data of 1024 bits is stored in the data input register, and each time data of 1024 bits is stored, the stored data in the data input register is transmitted to the input/output register.

The data input/output register supplies and receives data of 1024 bits in parallel to and from a data bus 1. If the reading operation is now made, the data of 1024 bits read on the data bus 1 is transferred in parallel to the data input/output register. If the writing operation is made, the write data of 1024 bits stored in the data input/output register is transferred in parallel to the data bus 1.

The data bus 1 has 512 read/write amplifiers #0~#511 provided thereon. Each of the read/write amplifiers #0~#511 has a D/A (digital/analog) converter and an A/D (analog/digital) converter. In other words, digital data of two bits is assigned between each read/write amplifier and the data bus 1. The D/A converter constitutes a write amplifier that receives a digital signal of 2 bits and produces an information voltage of four values. On the contrary, the A/D converter constitutes a read amplifier that converts the four-value information voltage read on a data bus 2 into a digital signal of 2 bits. The data bus 2 is formed of a pair of a reading data bus and writing data bus, or 512 pairs of signal lines corresponding to the 512 read amplifiers and 512 write amplifiers.

The number of memory arrays is 64, though not particularly limited thereto, and each of the memory arrays constitutes a memory bank. Each memory array has 4096 word lines and 512 bit lines. The word lines and bit lines include the write word lines WWL, read word lines RWL, write bit lines WBL and read bit lines RBL.

The I/O selection circuits select any one of the 64 memory banks (or memory mats) and connect the 512 pairs of write bit lines and read bit lines of the selected memory bank to the corresponding signal lines of the data bus 2. The write word lines and read word lines of each memory array are selected by a word driver.

This embodiment has an input/output interface similar to that of synchronous DRAM, though not particularly limited thereto. In other words, a clock enable signal CKE, a clock signal CLK, a chip select signal CS, a write enable signal WE, a row address strobe signal RAS and a column address strobe signal CAS are supplied to a control circuit. The chip select signal CS, write enable signal WE, row address strobe signal RAS and column address strobe signal CAS are fed as commands to a command decoder included in the control circuit.

The row address and column address are supplied in a time-sharing manner from address terminals A0~A11 to an address register. A part of the address signal in this address register is supplied to a mode register, and used as part of the commands. The row-based address signal A0~A11 (12 bits) fed in a time-sharing manner is held in a row address latch, and processed by a decoder to form a (1/4096) selection signal. The column-based address signal A0~A5 (6 bits) fed in a time-sharing manner is held in a column address latch, and processed by a decoder to form a (1/64) selection signal, or a selection signal for selecting any one of the 64 memory banks or memory mats.

Figure 19:
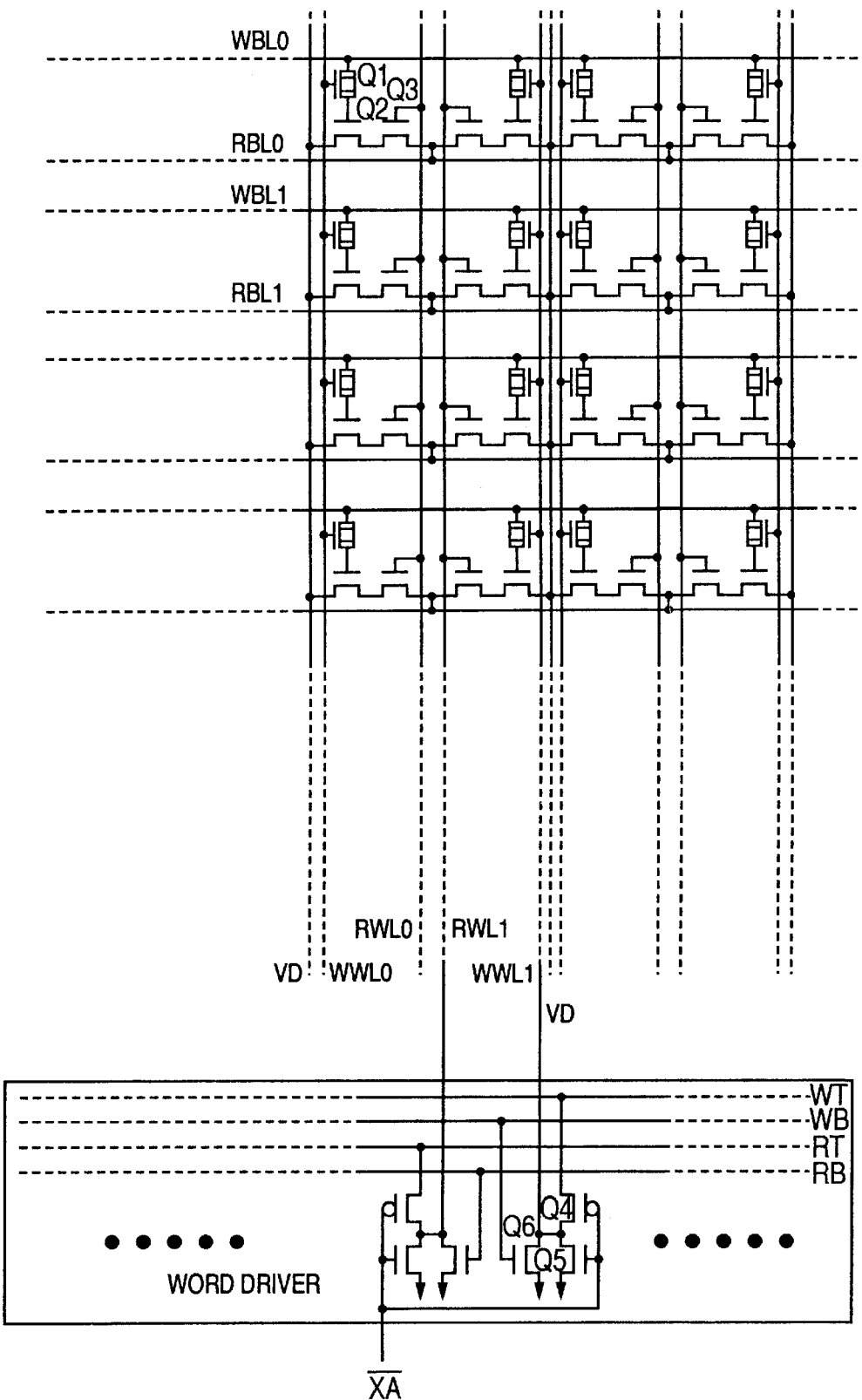
FIG. 19 is a circuit diagram showing part of the memory array and its peripheral circuit in the embodiment of FIG. 18.
Figure 20:
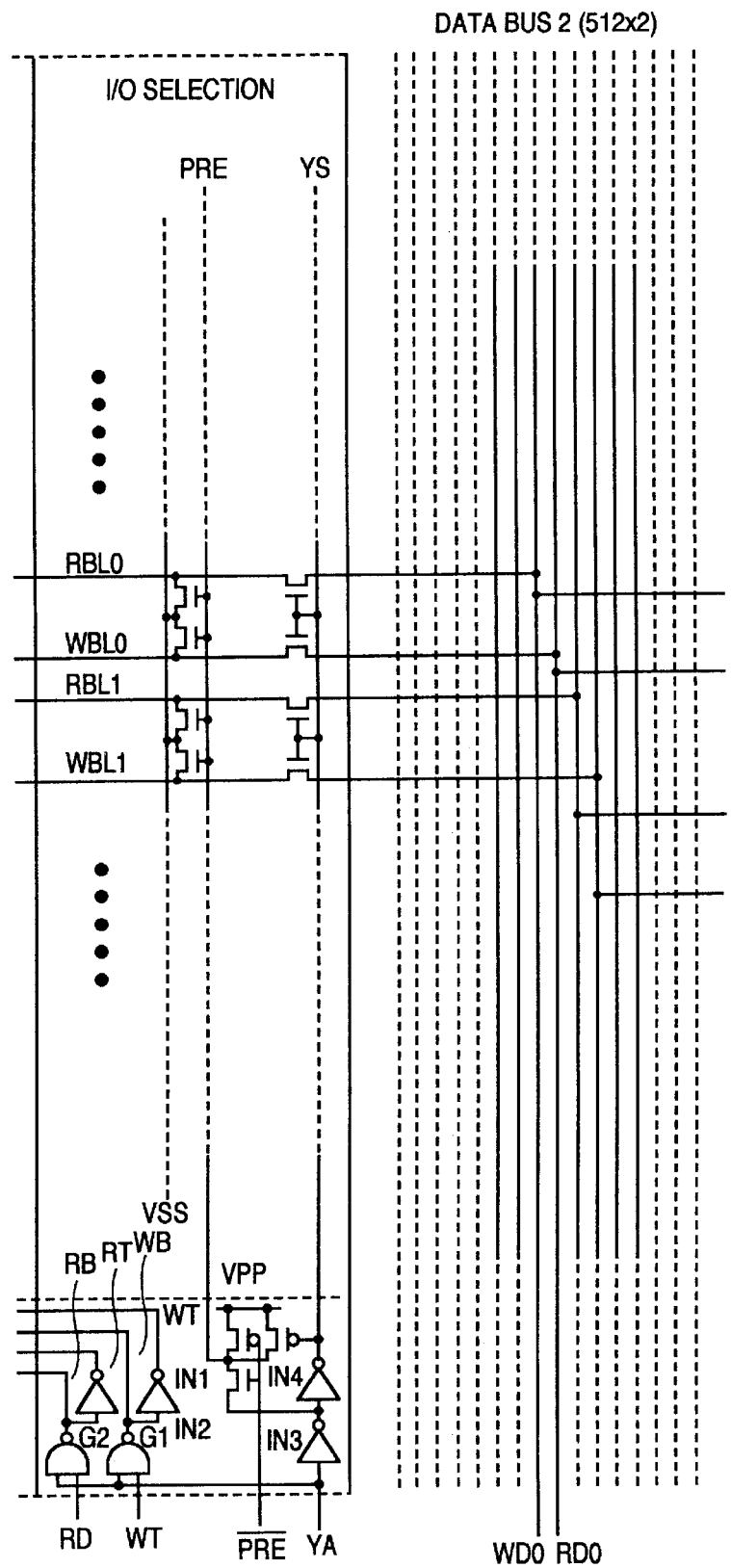
FIG. 20 is a circuit diagram showing another part of the memory array and its peripheral circuit in the embodiment of FIG. 18.
Figure 21:
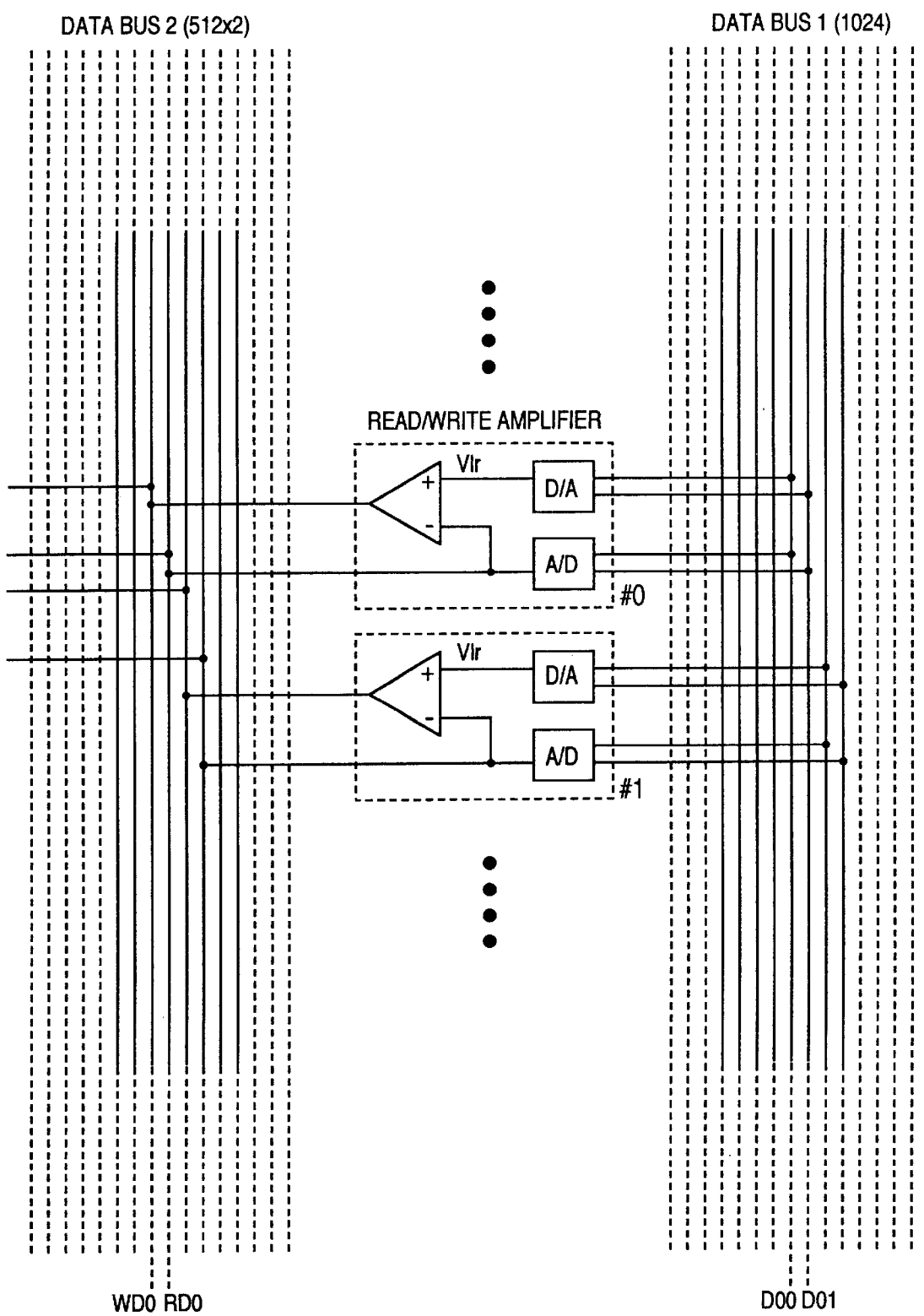
FIG. 21 is a circuit diagram showing part of the remaining portion of the memory array and its peripheral circuit in the embodiment of FIG. 18.

FIGS. 19 through 21 are circuit diagrams showing the memory array and its peripheral circuits in the embodiment of FIG. 18. In FIG. 19 the word driver and memory array are shown, and in FIG. 20 the I/O selection circuit and data bus 2 are shown. In addition, FIG. 21 shows the data bus 2, data bus 1 and the read/write amplifiers provided between those data buses.

In FIG. 19, each memory cell is similarly formed of three transistors as mentioned previously. However, the MOSFET Q2 and selection MOSFET Q3 are different from those in the previous embodiments. In this embodiment, the MOSFET Q2 is not forced to make sense (on/off) operation by applying a reference voltage to its source as in the previous embodiments, but is used as a source-follower amplifier-configuration MOSFET. In other words, the information voltage stored on the gate is level-shifted by the threshold voltage Vth through the gate and source, and produced from the source side. Therefore, the drain of the MOSFET Q2 is connected to the power supply line VD extended in the word line direction, though not particularly limited thereto. The selection MOSFET Q3 is provided between the source of the MOSFET Q2 and the read bit line RBL0. In addition, the PLED transistor Q1 is provided for writing between the write bit line WBL0 and the gate of the MOSFET Q2.

As typically illustrated in FIG. 19, the word driver corresponding to the write word line WWL1 connected to the gates of the PLED transistors has a CMOS inverter circuit including a P-channel MOSFET Q4 and N-channel MOSFET Q5 that receive a decode signal $\overline{XA}$, and a resetting MOSFET Q6 provided between the output side of the CMOS inverter circuit and the ground potential of the circuit. The output end of the CMOS inverter circuit is connected to the write word line WWL1. A write control voltage WT is applied to the source of the P-channel MOSFET Q4 of the CMOS inverter circuit, and a write control voltage WB to the gate of the MOSFET Q6. The voltages WT and WB are complementary. When the writing operation is ordered to make, the voltage WT becomes high level corresponding to the power voltage, and the voltage WB becomes low level corresponding to the ground potential of the circuit.

As typically illustrated, the word driver corresponding to the read word line RWL1 connected to the gates of the selection MOSFETs similarly has a CMOS inverter circuit including a P-channel MOSFET and N-channel MOSFET that receive the decode signal $\overline{XA}$, and a resetting MOSFET Q provided between the output side of the CMOS inverter circuit and the ground potential of the circuit. The output end of the CMOS inverter circuit is connected to the read word line RWL1. A read control voltage RT is applied to the source of the P-channel MOSFET of the CMOS inverter circuit, and a read control voltage RB to the gate of the resetting MOSFET. The voltages RT and RB are complementary. When the writing operation and reading operation are ordered to make, the voltage RT becomes high level corresponding to the source voltage, and the voltage RB becomes low level corresponding to the ground potential of the circuit.

The voltages WT, WB and RT, RB applied to the word driver are generated by gate circuits G1, G2 that receive a column-based selection signal YA and read/write control signals RD and WT, and inverter circuits IN10, IN11 as shown in FIG. 20.

As typically illustrated in FIG. 20, between the read bit lines RBL0, RBL1 and write bit lines WBL0, WBL1, there are provided MOSFETs to which the precharge signal PRE is fed to make these bit lines precharged (reset) to the ground potential VSS of the circuits. In addition, the bits lines RBL0, WBL0 are connected via the selection MOSFETs that are switching-controlled by a column selection signal YS to the corresponding read data line RD0 and write data line WD0 of the data bus 2, respectively. The other bit lines RBL1, WBL1 are also connected via the selection MOSFETs that are switching-controlled by the column selection signal YS to the corresponding read data line RD1 and write data line WD1 of the data bus 2, respectively.

The column selection signal YS is made to have a selection level corresponding to the boosted voltage VPP produced by boosting the operation voltage VD in order that the four-value information voltage transmitted between the bit line RBL, WBL and the data bus 2 can be prevented from being reduced by the amount corresponding to the threshold voltage of the switch MOSFETs. The inverter circuits IN3 and IN4 act so that the selection signal YA corresponding to the operation voltage can be level-shifted to the voltage VPP. The level of the precharge signal PRE transmitted to the gates of MOSFETs to reset the bit lines RBL and WBL are also raised to a high level corresponding to the boosted voltage VPP, though not particularly limited thereto.

The read/write amplifiers are provided between the data bus 2 and the data bus 1 as shown in FIG. 21. In other words, to a pair of write data line WD0 and read data line RD0 of data bus 2, there are assigned two bits of data line DO0, DO1 in the data bus 1. Therefore, the data bus and data bus 1 are each formed of the same 1024 signal lines.

The data lines DO0, DO1 of 2 bits of the data bus 1 are connected to the input terminal of the D/A converter and the output terminal of A/D converter of the read/write amplifier #0. In this embodiment, in order that the threshold voltages of the writing PLED transistor Q1 and amplifying MOSFET Q2 of the memory cells cannot be affected by the process variation, and that the write voltage to be held in the memory cells can be set with high precision, the write voltage Vir generated by the D/A converter is supplied to the non-inverting input terminal (+), and the signal to be written in the memory cells is fed back to the inverting input terminal (−) through the read-based signal line, or read bit line RBL0, and via the read data bus line RD0. Thus, a write voltage is generated so that both signals can be coincident with each other, and used as a voltage for writing the memory cells.

That is, the voltage Vir generated from the D/A converter is not used as it is, but applied to the non-inverting input (+) of the feedback amplifier, so that both voltages applied to the non-inverting and inverting terminals of the feedback amplifier can be coincident. The write voltage thus generated is held in the gate of the MOSFET Q2 of the memory cell. Therefore, in the memory array, the write word line WWL0 and read word line RWL0 are selected together, and the write voltage transmitted through the PLED transistor Q1 to the gate of the MOSFET Q2 is produced from the source as it is and fed back to the feedback amplifier, thus making it possible to form the write voltage including a value corresponding to the threshold voltage of MOSFET Q2, and also capable of compensating for the voltage loss in the signal transmission paths.

In this embodiment, the write voltage generated by the D/A converter is not uniformly written as an information voltage of four values in the memory cell, such a write voltage as to compensate for the process variations of the transistors that constitute each memory cell is generated and written. Particularly, since the information voltage held in the gate is read after being reduced by the amount corresponding to the threshold voltage of the MOSFET Q2 for making the source-follower amplification operation, the process variation of the threshold voltage might directly affect the operation margin, but use of the writing circuit or writing method of this embodiment makes it possible to accurately exclude the influence of the process variation of the threshold voltage that the source-follower amplification MOSFET has.

Figure 22:
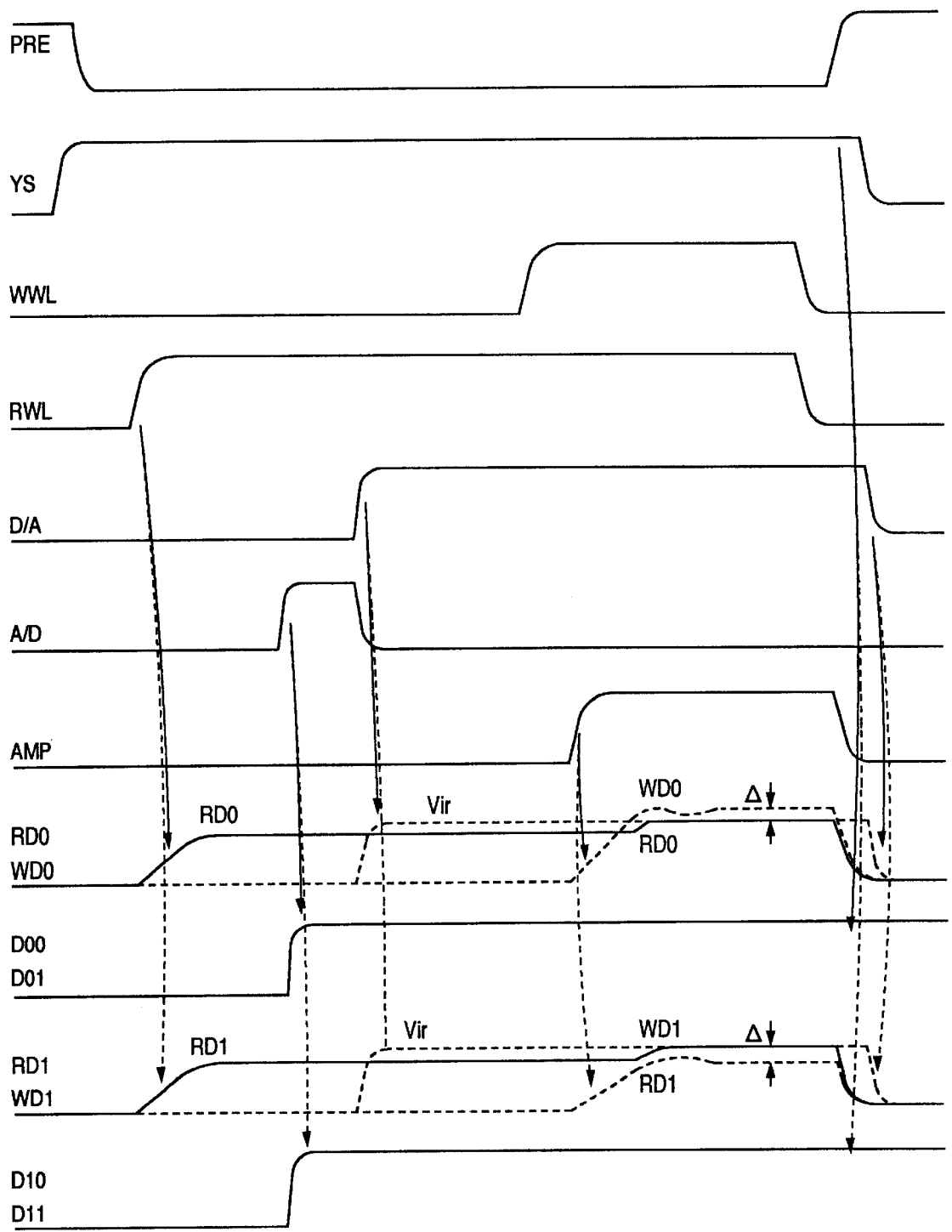
FIG. 22 is a waveform diagram to which reference is made in explaining the operation of the embodiment of FIGS. 19 to 21.

FIG. 22 is a waveform diagram to which reference is made in explaining the operation of the circuits of the embodiment shown in FIGS. 19 through 21. A particular one of the 64 memory arrays is selected according to the address signal. In other words, the column selection signal YS is turned to be high level, the precharge signal PRE in the selected memory array is changed from high level to low level, and the bit lines RBL, WBL are made to be at 0 V in a floating state.

The read word line RWL is selected according to the address signal. Thus, the information voltage of four values held in the memory cell is read out on the read data lines RD0, RD1 through the read bit line RBL and I/O switch MOSFET. When the A/D converter is activated, the information voltage on the read data lines RD0, RD1 is converted into digital data of 2 bits, and produced on the data lines D00, D01 and D10, D11 of data bus 1.

If the operation of the A/D converter is finished under this condition, and instead the D/A converter is activated, the read digital data of 2 bits is converted into the information voltage Vir of four values. If the feedback amplifier AMP is activated with the write word line WWL kept at the selection level, the potential of the write data lines WD0, WD1 is increased by a very small voltage Δ larger than the write information voltage Vir formed by the corresponding D/A converter, and written in the memory cell. In other words, this very small voltage Δ acts as a voltage corresponding to the effective threshold voltage of the source-follower amplification MOSFET. Thus, the information voltage held in the memory cell is written after being slightly more increased than in the reading operation. That is, under the condition in which the information voltage is held, the voltage decreased by the leakage current or the like is restored to the original information voltage. In other words, the refresh operation is carried out.

In the read operation mode, when this write word line is selected and the feedback amplifier AMP is operated, the refresh operation is performed together with the reading operation like the DRAM. When the PLED transistor is used as a writing transistor as above, the leakage current is theoretically zero, and thus there is no need to write at each time of reading operation as above. However, it is useful for the data reliability to be increased.

Since writing data is applied to the data bus 1 in the writing operation, this data is converted by the D/A converter into the information voltage Vir, which is then stored in the memory cell. In this case, too, the read word line is selected, and the feedback amplifier is operated. Then, the information voltage written in the memory cell is read out, and written as if it were written while being monitored. In the feedback path, if a voltage loss is caused in the writing transistor or selection MOSFET in addition to the source-follower amplification MOSFET, such information voltage as to compensate for the voltage loss is held in the memory cell.

Figure 23:
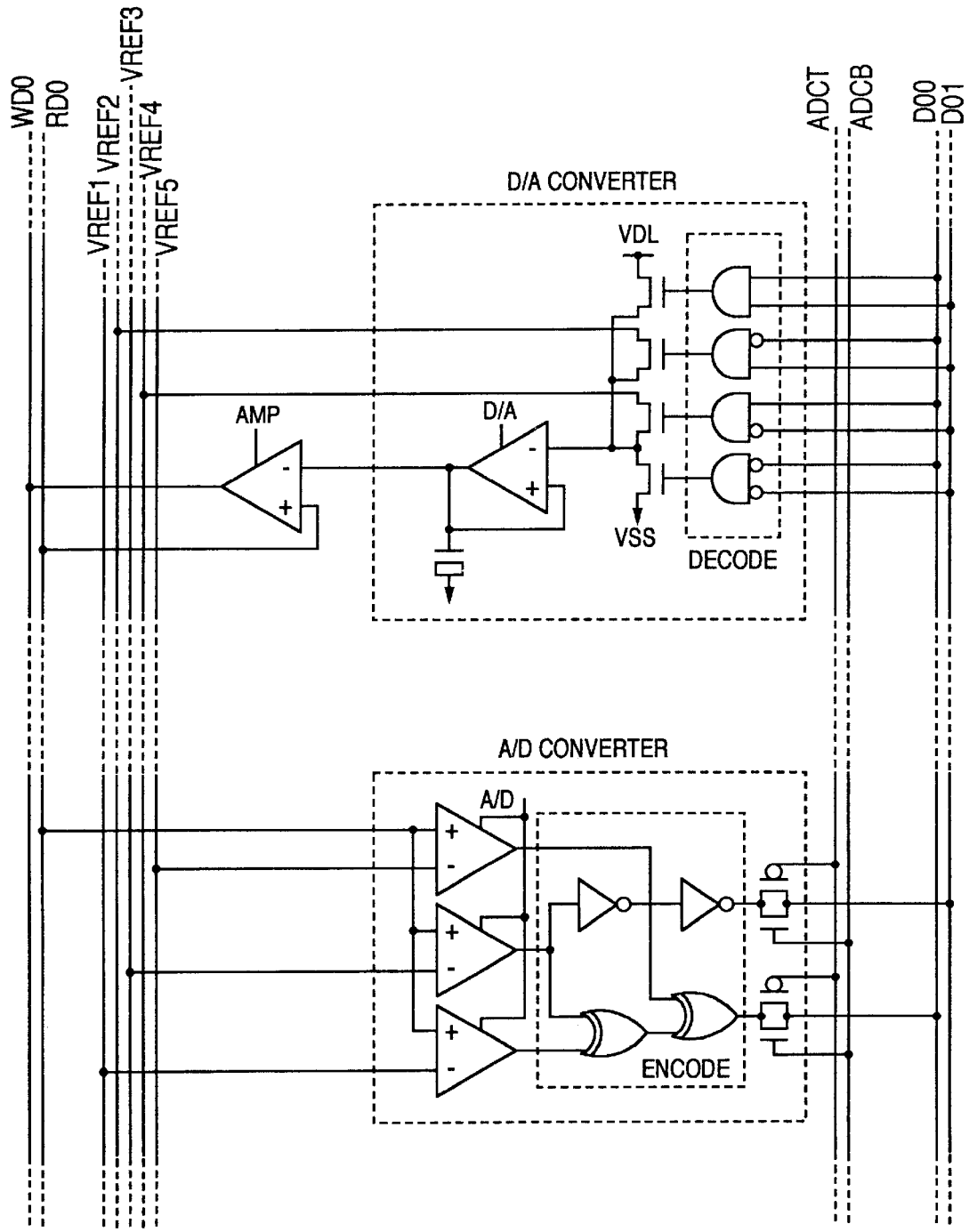
FIG. 23 is a circuit diagram showing an example of the read/write amplifier in the embodiment of FIG. 21.

FIG. 23 is a circuit diagram of an example of the read/write amplifier used in this invention. The D/A converter has a decoder circuit including four gate circuits for receiving digital data of 2 bits D00, D01, and generates four different decoded signals from the decoder circuit. These decoded signals control the switch MOSFETs. If the digital data D00, D01 is "11", the MOSFET that produces the voltage VDL is turned on. If the digital data D00, D01 is "10", the MOSFET that produces the reference voltage VREF2 is turned on. If the digital data D00, D01 is "01", the MOSFET that produces the reference voltage VREF4 is turned on. If the digital data D00, D01 is "00", the MOSFET that produces the ground potential VSS of the circuit is turned on.

This information voltage of four values is transmitted to the feedback amplifier circuit via the amplifier circuit that is activated by the control signal D/A. The feedback amplifier circuit is activated by the control signal AMP to produce a write voltage so that the write voltage corresponding to the VDL, VREF2, VREF4 or VSS and the information voltage read from the memory cell are coincident with each other.

The A/D converter has three voltage comparator circuits that receive three different reference voltages of VREF1, VREF3 and VREF5, and an encoder circuit for receiving the output signals from the comparator circuits. The encoder circuit is formed of a combination of inverter circuits and exclusive OR circuits. In other words, when the read information voltage is larger than VREF1, the three voltage-compared outputs are all high level, thus an output signal of "11" being produced. If the read information voltage has a value between the VREF1 and VREF3, the three voltage-compared outputs become low level, high level and high level, respectively, thus an output signal of "10" being produced. If the read information voltage has a value between VREF3 and VREF5, the three voltage-compared outputs are low level, low level and high level, respectively, thus an output signal of "01" being produced. If the read information output is less than VREF5, the three voltage-compared outputs are all low level, thus an output signal of "00" being produced.

Figure 24A:
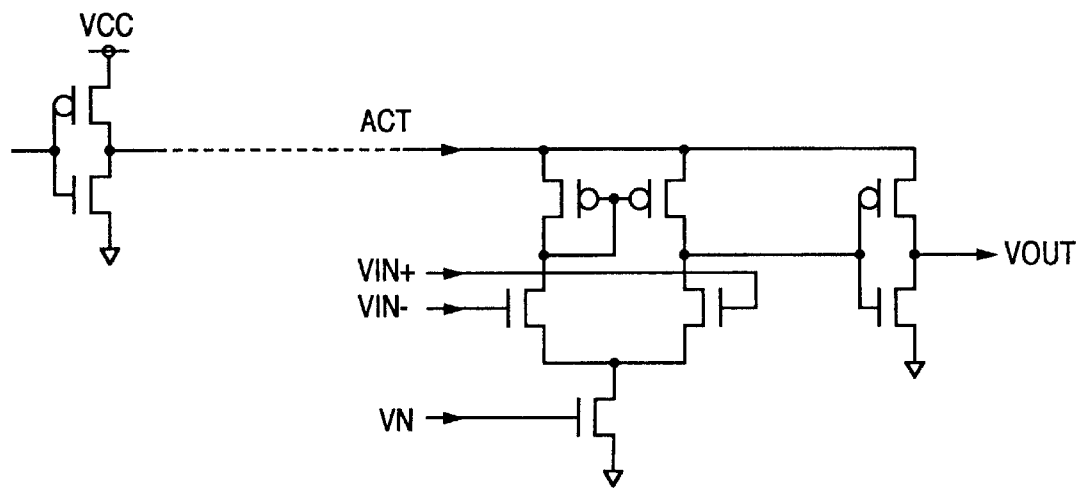
FIGS. 24A and 24B are circuit diagrams of the voltage comparator circuit in the embodiment of FIG. 23.
Figure 24B:
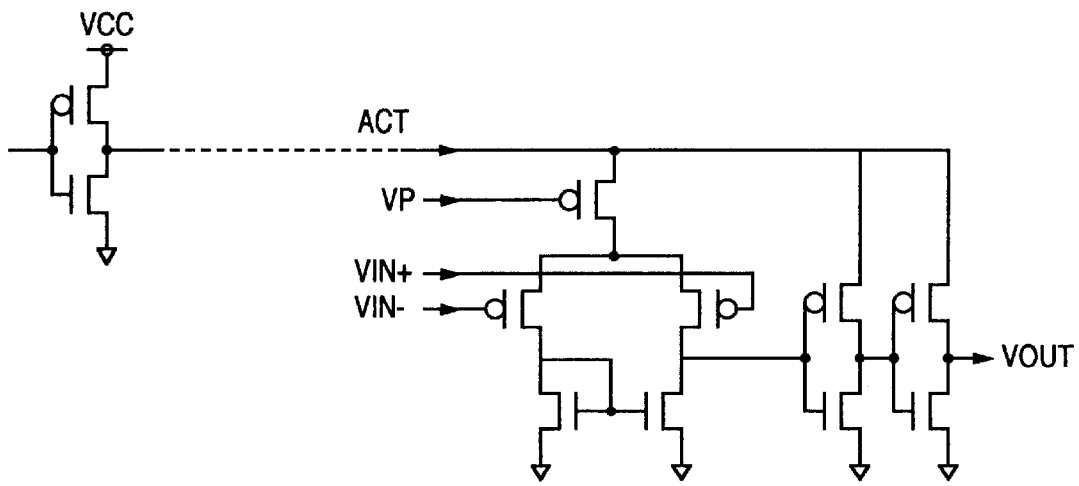

FIGS. 24A and 24B are circuit diagrams of the voltage comparator circuit in the embodiment of FIG. 23.

In this embodiment, the voltage comparator has a differential amplifier circuit of which the operating voltage is given by the control signal ACT generated from the inverter circuit, and an output inverter circuit to which the control voltage ACT is also applied. In the comparator circuit shown in FIG. 24A, the differential MOSFETs are formed of N-channel MOSFETs, and P-channel MOSFETs as a load are constructed in a current-mirror configuration. An N-channel MOSFET for receiving a constant voltage VN is provided as a constant-current source to be connected to the common source of the differential MOSFETs.

In the comparator circuit of FIG. 24B, the differential MOSFETs are formed of P-channel MOSFETs, and N-channel MOSFETs as a load are constructed in a current-mirror configuration. A P-channel MOSFET for receiving a constant voltage VP is provided as a constant-current source to be connected to the common source of the differential MOSFETs. Two inverter circuits are cascaded as the output circuit.

The above voltage comparator circuits each have the constant-current source MOSFET provided between the power supply terminal and ground terminal to allow a DC current to flow in a steady state. Therefore, only when the control signal ACT generated from the inverter circuit becomes high level like the power supply voltage, the above operating current flows, so that the consumption current can be minimized. Particularly, even if the voltage comparator circuits used in the 512 read/write amplifiers are operated in a steady state for fast operation, a large consumption current flows, and thus the indirect operation control becomes valuable.

The voltage-follower amplifier circuit and feedback amplification circuit used in the D/A converter employ the same differential circuits. However, since the output signal is produced as an analog signal, the output circuit is not an inverter circuit, but an analog amplifier circuit that is formed of an amplifying MOSFET that receives the output signal from the differential circuit, and load means. Even this analog amplifier circuit is intermittently operated by the activating signal AMP, D/A so that a consumption current is allowed to flow only when it is required.

Figure 25:
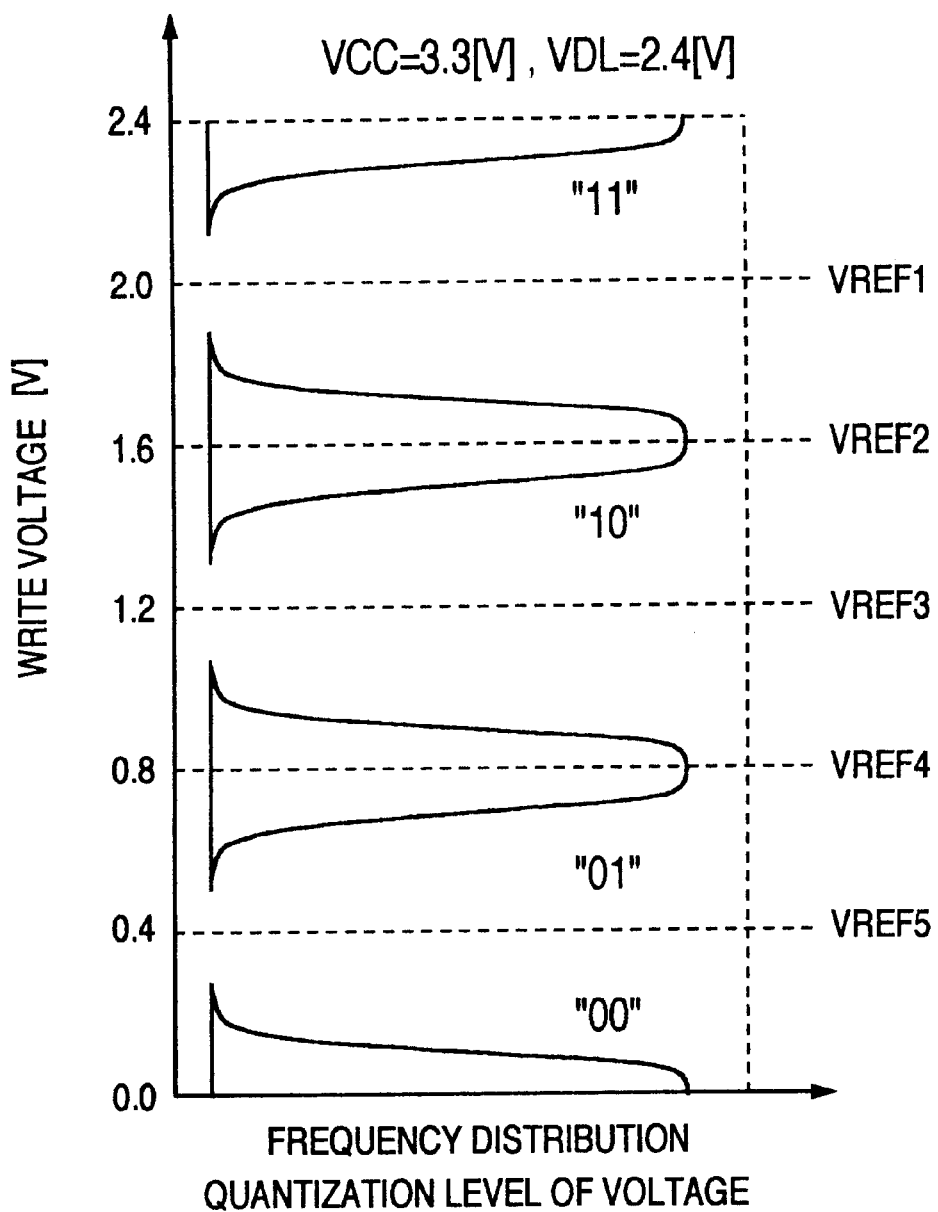
FIG. 25 is a graph showing the potential distribution of the writing voltage in the embodiment of FIGS. 19 to 21.

FIG. 25 is a diagram schematically showing the writing potential distribution. The maximum potential is 2.4 V, and divided into four different voltage regions, though not particularly limited thereto. In this embodiment, 0 V is defined as data of "00", 0.8 V (VREF4) as data of "01", 1.6 V (VREF2) as data of "10", and 2.4 V (VDL) as data of "11". The width of each distribution considers the characteristic variations of the memory cells.

The reference voltages used for A/D conversion are reference voltages VREF1, VREF3, and VREF5 as the mid voltages between the above set voltages VDL, VREF2, VREF4 and VSS. In other words, if the read information voltage is between the reference voltages VREF1, VREF3 and VREF5, it is converted into data of 2 bits by the A/D conversion operation. In this embodiment, although the ordinate is the writing voltage, it is not the voltage that has actually been written in the memory cell. It is the four different information voltages generated by the D/A converter as above, or corresponds to the voltage read from the memory cell. The width of each distribution considers the characteristic variations of the memory cells, but the threshold voltage of the source-follower MOSFET is excluded.

Figure 26:
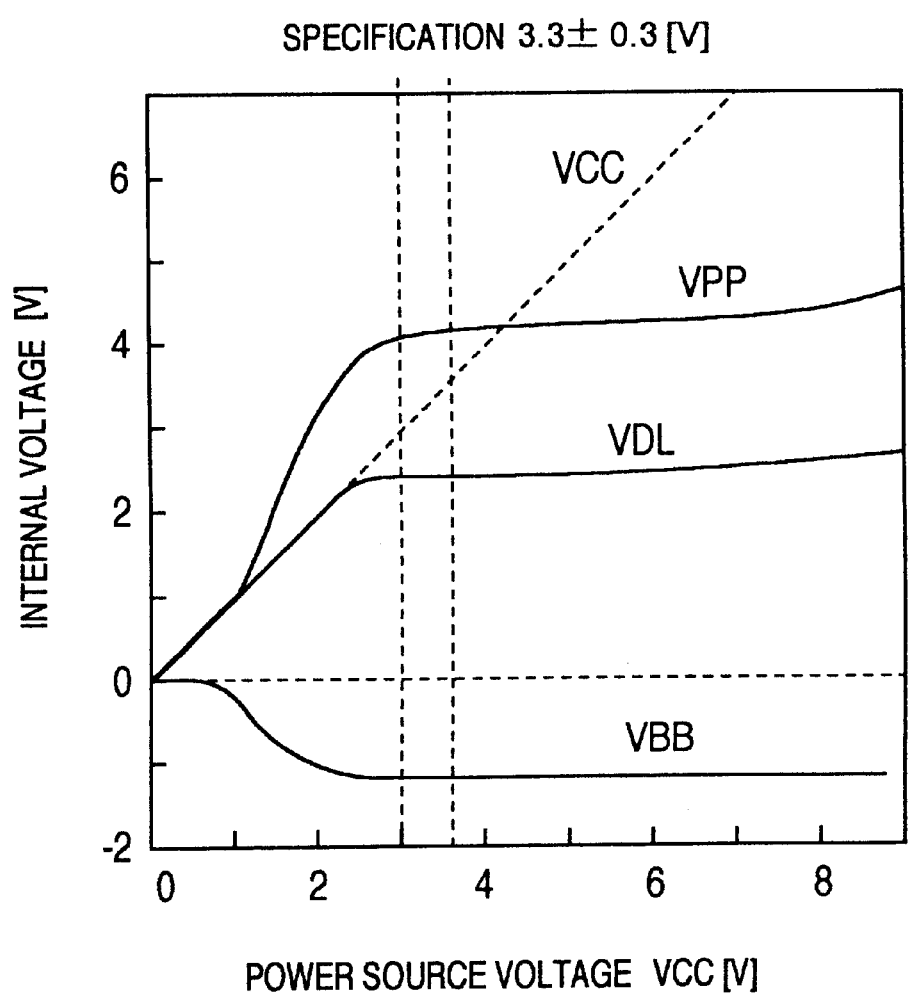
FIG. 26 is a voltage characteristic diagram in the embodiment of FIG. 18.

FIG. 26 is a voltage characteristic diagram of the embodiment of FIG. 18. That is, the source voltage VCC is specified to be 3.3±0.3 V, and the internal voltage VDL is made constant by an internal voltage-drop circuit. The boosted voltage VPP is generated by a charge pump circuit using the internal voltage VDL, and selected to be about 4 V. The substrate voltage VBB is set to be about −1.1 V by the charge pump circuit using the internal voltage VDL. This substrate voltage VBB may be provided with a temperature dependency so that the source-follower amplification MOSFET can be prevented from being decreased in Vth at high temperatures and increased in Vth at low temperatures.

Figure 27A:
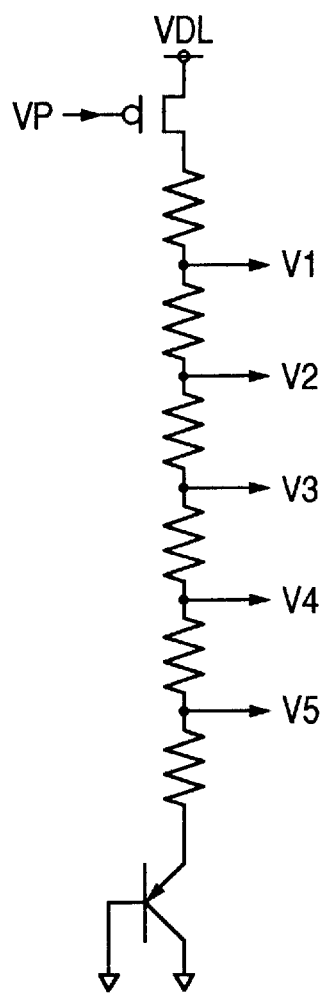
FIGS. 27A, 27B and 27C are circuit diagrams of the reference voltage generator circuit that can be used in the embodiments of the invention.
Figure 27B:
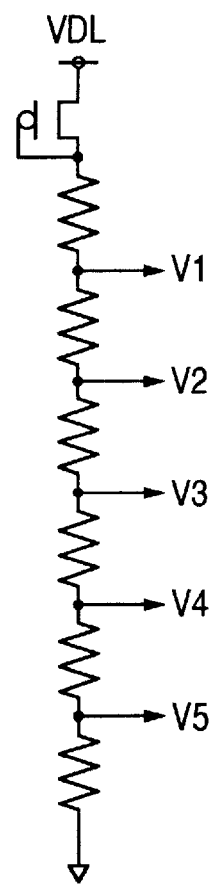
Figure 27C:
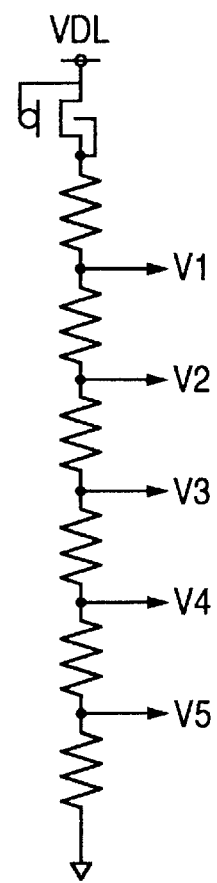

FIGS. 27A, 27B and 27C are circuit diagrams of examples of the reference voltage generator circuit that can be used in the embodiments of the invention. In the reference voltage generator of FIG. 27A, a P-channel MOSFET is driven by the constant voltage VP so that a constant current flows in a series of resistors, thus developing voltages V1~V5 across them as the reference voltages VREF1~FREF5. The resistors connected in series are connected to a diode-configuration transistor capable of temperature compensation. In other words, the base-emitter voltage of a lateral parasitic bipolar transistor, the threshold voltage of the MOSFET and the resistors are combined to cancel out the temperature dependency of the threshold voltage of the source-follower amplification MOSFET.

In the reference voltage generator of FIG. 27B, the internal voltage VDL is divided simply by voltage-dividing resistors to produce voltages V1~V5 as the reference voltages VREF1~FREF5. The resistors connected in series are connected to a P-channel MOSFET of diode configuration for temperature compensation. In the reference voltage generator of FIG. 27C, the internal voltage VDL is simply divided by voltage-dividing resistors to produce the voltages V1~V5 corresponding to the reference voltages VREF1~FREF5. The resistors connected in series are connected to an N-channel MOSFET of diode configuration for temperature compensation. That is, at high temperatures, the reference voltage VREF is increased in association with the reduction of Vth, and at low temperatures, the reference voltage VREF is reduced in association with the increase of Vth.

Figure 28A:
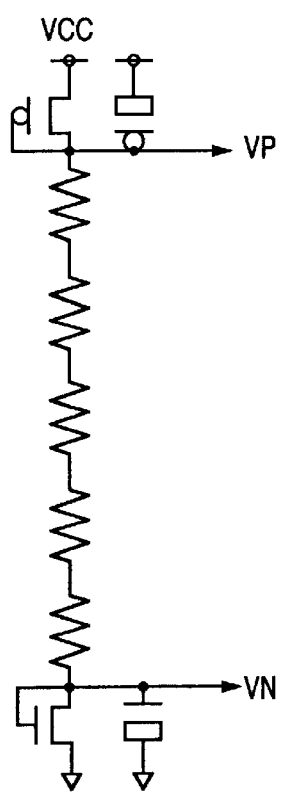
FIGS. 28A and 28B are circuit diagrams of the voltage generator circuit that can be used in the embodiments of the invention.
Figure 28B:
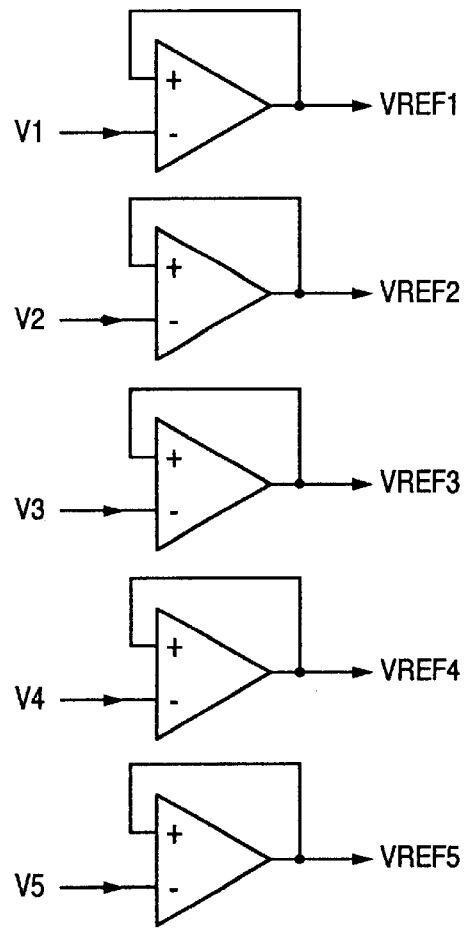

FIGS. 28A and 28B are circuit diagrams of examples of the voltage generator circuits used in the embodiments of the invention. FIG. 28A shows the voltage generator circuit for producing the constant voltages VP and VN. The constant voltages are produced by a P-channel MOSFET, and N-channel MOSFET of diode configuration, and high-resistance means provided between them. In other words, the current flowing in the resistors is made constant by the high resistance so as not to be affected by the variation of the power source voltage VCC, and further caused to flow in the P-channel and N-channel MOSFETs of diode configuration, thereby producing the constant voltages VP and VN. FIG. 28B shows buffer circuits that receive the divided voltages V1~V5 and generate the reference voltages VREF1~VREF5.

The action and effects obtained by the above embodiments include the following.

(1) Memory cells each includes a MOSFET that has an information voltage of three or more values held in its gate, a writing transistor from which this information voltage is supplied, and a transistor connected in series with the MOSFET so as to allow the read-out current to flow therein. A plurality of reference voltages corresponding to the three or more values are applied to the source of the MOSFET, thereby reading out information of the three or more values according to a combination of the on-state/off-state of the MOSFET and the plurality of applied reference voltages. Thus, an information voltage of three or more values can be read out by a simple circuit arrangement.

(2) In addition to the above, the above reading transistor is formed of a MOSFET, and the above writing transistor is formed of a transistor of barrier-insulating film structure including a PLED transistor, thus making it possible to store the information voltage in a nonvolatile manner. Thus a large amount of information can be stored at a time with high reliability, and the usability can be improved.

(3) In addition to the above, the transistor of barrier-insulating film structure including the PLED transistor is built up to have a longitudinal current path that extends to the surface of the gate electrode of the MOSFET. Thus, the memory cells can be integrated at high density, thus achieving a large-storage capacity, high-reliability memory combined with the operation of storing multi-value information.

(4) In addition to the above, the gate electrodes of the MOSFET and the MOSFET of the reading transistor are provided in parallel between a pair of source and drain diffusion layers, thus making it possible to omit the source and drain diffusion layers between the two MOSFETs so that the memory cells can be integrated at a higher density.

(5) In addition to the above, the above information voltage is formed of four values, and each memory cell is allowed to store 2 bits, thus making it possible to achieve a high-reliability, large-storage capacity memory device.

(6) In addition to the above, common bit lines are substituted for the write bit lines and read bit lines, thereby making it possible to simplify the structure of the memory device and the manufacturing process for the memory device.

(7) In addition to the above, the above reference voltages are sequentially applied in the order of higher voltages beginning with the voltage corresponding to the highest reference voltage, thereby making it possible to reduce the reading operation time and the consumption power.

(8) In addition to the above, write input lines, and write selection MOSFETs that connect the write input lines and the write bit lines are further provided, and in the writing operation mode the information voltage transmitted to the write input lines is transmitted to the gates of the MOSFETs of the memory cells corresponding to the write word lines selected by sequentially turning the write selection MOSFETs on, thus making it possible that data can be written sector unit by sector unit in a short time like disk memory.

(9) In addition to the above, read output lines and read selection MOSFETs that connect the read output lines and the read bit lines are further provided, and in the reading operation mode the read signals produced on the read bit lines in association with the plurality of reference voltages are sequentially transmitted through the read selection MOSFETs to the read output lines, and converted into read data of a plurality of bits corresponding to the information voltage, thus making it possible that data can be written sector by sector in a short time like disk memory.

(10) In addition to the above, the selection circuits for the write word lines and read word lines are separately provided on both sides of the memory array in its extended direction, and the write input lines, write selection MOSFETs, read output lines and read selection MOSFETs associated with the write bit lines and read bit lines are separately provided on both sides of the memory array in its extended direction, thus making it possible that the circuits can be rationally arranged at the same pitch as the word lines and bits lines.

(11) Memory cells including a MOSFET that has an information voltage of three or more values held in its gate, a writing transistor by which the information voltage is applied, and a transistor connected in series with the MOSFET to allow a read current to flow therein are used, and a read voltage is produced from the source of the MOSFET, and converted into a digital signal, thereby making it possible to fast write and read the information voltage of three or more values.

(12) In addition to the above, the reading transistor is formed of a MOSFET, and the writing transistor is formed of a transistor of barrier-insulating film structure including a PLED transistor, thereby making it possible to store the information voltage in a nonvolatile manner so that a high-reliability, large-storage capacity memory device can be produced, and that the usability can be improved.

(13) In addition to the above, the writing transistor having the barrier-insulting film structure including the PLED transistor is built up to have a longitudinal current path extended to the surface of the gate electrode of the MOSFET, thereby making it possible that the memory cells can be integrated at high density so that a high-reliability, large-storage capacity memory device can be produced in cooperation with the operation of storing multi-value information.

(14) In addition to the above, the gate electrodes of the MOSFET and the MOSFET that constitutes the reading transistor are provided in parallel between a pair of source and drain diffusion layers, thus making it possible to omit the source and drain diffusion layers between the two MOSFETs so that the memory cells can be integrated at a higher density.

(15) In addition to the above, the information voltage is formed of four values, and information of 2 bits is stored in each memory cell, thus making it possible to achieve a high-reliability, large-storage capacity memory device.

(16) In addition to the above, in the writing operation mode the write word lines and read word lines are selected, and the write voltage is generated so that the voltage obtained from the source of the MOSFET coincides with the information voltage to be written, and transmitted to the gate of the MOSFET, thereby making it possible to hold the information voltage that can be compensated for the process variation of the threshold voltages of the MOSFETs of the memory cells, so that a high-reliability, large-storage capacity memory device can be produced.

(17) In addition to the above, the information voltage to be written and the voltage produced from the source of the MOSFET are applied to the non-inverting input terminal and the inverting input terminal of a voltage comparator circuit, and the voltage to be written in a memory cell is generated by the voltage comparing operation, thereby making it possible to hold the information voltage that can be compensated for the process variation of the threshold voltages of the MOSFETs of the memory cells, so that a high-reliability, large-storage capacity memory device can be produced.

(18) In addition to the above, the information voltage to be written that is applied to the non-inverting input terminal of the voltage comparator circuit is generated by a digital/analog converter circuit, and the voltage produced from the source of the MOSFET is also supplied to an analog/digital converter circuit for producing the read data, thereby making it possible that the reading-system circuits are effectively used for the writing operation.

The invention by the inventors has been specifically described on the basis of the embodiments. The invention of this application is not limited to those embodiments, but can of course be changed differently without departing from the scope of the invention. For example, in the embodiment of FIG. 1 or FIG. 18, the memory cells of a memory array that are connected to the word lines may be read/written in a smaller number of bits than the reading/writing operation between the memory cells and the external terminals.

Since the embodiment of FIG. 18 needs 512 read/write amplifiers, the circuit scale becomes large, and the consumption current is also relatively increased. Thus, for example, it is possible that data of 16 bits is inputted from and outputted to the output terminals at a time, while data of twice or four times that amount, or of 32 bits or 64 bits is written in or read from the memory cells in the inside of the memory device. In this case, each of the data bus 1 and data bus 2 is formed of 32 or 64 lines, and 16 or 32 read/write amplifiers are also required.

In the embodiment of FIG. 2 or FIG. 3, the source line of the sense MOSFET may be provided in association with each word line. In other words, if a large number of memory cells are connected to the source line, the parasitic capacitance will be increased, and it will take a long time to set the source voltage of the sense MOSFET of the selected memory cell for a desired reference voltage because of the parasitic capacitance and wiring resistance of the source line as described above, thus increasing the reading time. Therefore, such reference voltages as described above are applied to the source line associated with the memory cells connected to the word lines selected by the selection signal for the word lines, thereby making it possible to reduce the reading time and improve the operation margin.

The writing transistors may be switching elements having no leakage current paths such as p-n junctions like the transistors of the barrier-insulating film structure as represented by the PLED transistor. That is, they may be devices that do not need to always refresh with a extremely short period like DRAM. The voltage to be stored does not need to be four values, but may be three or more values. This invention can be widely used as a semiconductor memory device.

What is claimed is:

1. A semiconductor memory device comprising:
   a plurality of memory cells each having a MOSFET for holding an information voltage of three or more values at its gate, a writing transistor for applying said information voltage of three or more values to said gate of said MOSFET, and a reading transistor connected in series with said MOSFET;
   a plurality of write word lines for controlling said writing transistors in a switching manner in accordance with an address signal;
   a plurality of read word lines for controlling said reading transistors in a switching manner in accordance with an address signal;
   a plurality of write bit lines arranged in the direction perpendicular to said write word lines, and to which said information voltage is transmitted;
   a plurality of read bit lines arranged in the direction perpendicular to said read word lines and to which a memory current flowing through said MOSFET and said reading transistor is transmitted; and
   source lines from which a plurality of reference voltages corresponding to said information voltage of three or more values are applied to said sources of said MOSFETs,
   information of three or more values being read out by a combination of the on-state/off-state of said MOSFET and said plurality of reference voltages.

2. A semiconductor memory device according to claim 1, wherein said reading transistor is formed of a MOSFET, and said writing transistor is formed of a barrier-insulating film structure including a PLED transistor.

3. A semiconductor memory device according to claim 2, wherein said writing transistor having said barrier-insulting film structure including said PLED transistor is built up on the gate electrode of said MOSFET to have a longitudinal current path extended to the surface of said gate electrode.

4. A semiconductor memory device according to claim 3, wherein the gate electrodes of said MOSFET and the MOSFET of said reading transistor are provided in parallel between a pair of source and drain diffusion layers.

5. A semiconductor memory device according to claim 1, wherein said information voltage is formed of four values, and 2 bits are stored in each memory cell.

6. A semiconductor memory device according to claim 1, wherein said write bit lines and said read bit lines are formed of common bit lines.

7. A semiconductor memory device according to claim 1, wherein said reference voltages are applied in the order of higher reference voltages beginning with the highest reference voltage.

8. A semiconductor memory device according to claim 1, further comprising write input lines, and write selection MOSFETs connecting said write input lines and said write bit lines, wherein
   in the writing operation, said information voltage transmitted to said write input lines is applied to the gates of said MOSFETs of the memory cells associated with the write word line selected by sequentially turning on said write selection MOSFETs.

9. A semiconductor memory device according to claim 8, further comprising read output lines, and read selection MOSFETs connecting said read output lines and said read bit lines, wherein
   in the reading operation, read signals produced on said read bit lines in accordance with said plurality of reference voltages are sequentially transmitted through said read selection MOSFETs to said read output lines, and converted into read data of a plurality of bits corresponding to said information voltage.

10. A semiconductor memory device according to claim 1, wherein
    selection circuits for said write word lines and said read word lines are separately provided on both sides of the memory array in the extended direction, and
    said write input lines, said write selection MOSFETs, and said read output lines, said read selection MOSFETs given for said write bit lines and said read bit lines are separately provided on both sides of the memory array in the extended direction.

11. A semiconductor memory device comprising:
    a plurality of memory cells each having a MOSFET for holding an information voltage of three or more values at its gate, a writing transistor for applying said information voltage of three or more values to said gate of said MOSFET, and a reading transistor connected in series with said MOSFET;
    a plurality of write word lines for controlling said writing transistors in a switching manner in accordance with an address signal;
    a plurality of read word lines for controlling said reading transistors in a switching manner in accordance with an address signal;
    a plurality of write bit lines arranged in the direction perpendicular to said write word lines, and to which said information voltage is transmitted; and
    a plurality of read bit lines arranged in the direction perpendicular to said read word lines and to which a source voltage of said MOSFET is transmitted through said reading transistor, wherein
       a read voltage corresponding to the source voltage of said MOSFET is converted into a digital signal, wherein
          said reading transistor is formed of a MOSFET, and said writing translator Is formed of a barrier-insulating film structure including a PLED transistor.

12. A semiconductor memory device according to claim 11, wherein said writing transistor having said barrier-insulating film structure including said PLED transistor is built up on the gate electrode of said MOSFET to have a longitudinal current path extended to the surface of said gate electrode.

13. A semiconductor memory device according to claim 12, wherein the gate electrodes of said MOSFET and said MOSFET of said reading transistor are provided in parallel between a pair of source and drain diffusion layers.

14. A semiconductor memory device according to claim 11, wherein said information voltage is formed of four values, and 2 bits are stored in each memory cell.

15. A semiconductor memory device comprising:
    a plurality of memory cells each having a MOSFET for holding an information voltage of three or more values at its gate, a writing transistor for applying said information voltage of three or more values to said gate of said MOSFET, and a reading transistor connected in series with said MOSFET;
    a plurality of write word lines for controlling said writing transistors in a switching manner in accordance with an address signal;
    a plurality of read word lines for controlling said reading transistors in a switching manner in accordance with an address signal;

a plurality of write bit lines arranged in the direction perpendicular to said write word lines, and to which said information voltage is transmitted; and a plurality of read bit tines arranged in the direction perpendicular to said read word lines and to which a source voltage of said MOSFET is transmitted through said reading transistor, wherein a read voltage corresponding to the source voltage of said MOSFET is converted into a digital signal, wherein in the writing operation, said write word lines and said read word lines are selected, and a write voltage is produced so that the voltage produced from the source of said MOSFET and said information voltage to be written are coincident with each other, and transmitted to the gate of said MOSFET.

16. A semiconductor memory device according to claim 15, wherein said write voltage is produced from a voltage comparator circuit having a non-inverting input terminal to which said information voltage to be written is applied, and an inverting input terminal to which the voltage from the source of said MOSFET is applied.

17. A semiconductor memory device according to claim 16, wherein said information voltage to be written that is supplied to the non-inverting input terminal of said voltage comparator circuit is produced from a digital/analog converter circuit, and the voltage produced from the source of said MOSFET is also applied to an analog/digital converter circuit that produces read data.

* * * * *